(12) United States Patent
Yamazaki et al.

(10) Patent No.: US 7,663,305 B2
(45) Date of Patent: Feb. 16, 2010

(54) LIGHT EMITTING DEVICE AND METHOD OF MANUFACTURING THE SAME

(75) Inventors: Shunpei Yamazaki, Tokyo (JP); Takeshi Noda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 27 days.

(21) Appl. No.: 10/602,980

(22) Filed: Jun. 24, 2003

(65) Prior Publication Data

US 2005/0073243 A1    Apr. 7, 2005

(30) Foreign Application Priority Data

Jun. 27, 2002    (JP)    ............................. 2002-187621

(51) Int. Cl.
*H01J 1/62*    (2006.01)
(52) U.S. Cl. .................................... 313/506
(58) Field of Classification Search ............... 313/506
See application file for complete search history.

(56) References Cited

U.S. PATENT DOCUMENTS

| | | | |
|---|---|---|---|
| 4,411,735 A | 10/1983 | Belani | |
| 5,047,687 A | 9/1991 | VanSlyke | |
| 5,049,780 A | 9/1991 | Dobrowolski et al. | 313/509 |
| 5,063,327 A | 11/1991 | Brodie et al. | |
| 5,232,549 A | 8/1993 | Cathey et al. | |
| 5,640,067 A | 6/1997 | Yamauchi et al. | |
| 5,684,365 A | 11/1997 | Tang et al. | |
| 5,742,129 A * | 4/1998 | Nagayama et al. | 315/167 |
| 5,786,664 A | 7/1998 | Liu | 313/506 |
| 5,839,456 A | 11/1998 | Han | |
| 5,962,962 A | 10/1999 | Fujita et al. | |
| 6,037,712 A | 3/2000 | Codama et al. | |

(Continued)

FOREIGN PATENT DOCUMENTS

EP    0717445 A2    6/1996

(Continued)

OTHER PUBLICATIONS

Machine translation of JP 2000-269473 has been provided for Applicant's convenience.*

(Continued)

*Primary Examiner*—Nimeshkumar D. Patel
*Assistant Examiner*—Anthony T Perry
(74) *Attorney, Agent, or Firm*—Cook Alex Ltd.

(57) ABSTRACT

In a top emission structure, there has been a problem in that a wiring, a TFT, or the like is provided in regions other than a light emitting region so that light reflected by the wiring reaches eyes of an observer. The present invention prevents light that is reflected by a wire from reaching eyes of an observer by providing a light-absorbing multilayer film (61) in regions other than a light emitting region. Specifically, the light-absorbing multilayer film (61) is used as an upper layer of a partition wall (also called as a bank or a barrier) that covers ends of a first electrode (66*b*) whereas an organic resin film (67) is used as a lower layer of the partition wall. The partition wall in the present invention is characterized by being a laminate of three or more layers formed of different materials.

58 Claims, 11 Drawing Sheets

U.S. PATENT DOCUMENTS

| | | | |
|---|---|---|---|
| 6,091,195 A | 7/2000 | Forrest et al. ............... 313/504 |
| 6,107,158 A | 8/2000 | Zheng et al. |
| 6,114,715 A * | 9/2000 | Hamada ..................... 257/72 |
| 6,194,837 B1 | 2/2001 | Ozawa |
| 6,222,315 B1 | 4/2001 | Yoshizawa et al. |
| 6,272,612 B1 | 8/2001 | Bordaz et al. |
| 6,306,559 B1 | 10/2001 | Tanamura et al. |
| 6,320,311 B2 | 11/2001 | Nakaya et al. |
| 6,380,687 B1 | 4/2002 | Yamazaki ................ 315/169.3 |
| 6,384,427 B1 | 5/2002 | Yamazaki et al. ............. 257/59 |
| 6,396,208 B1 * | 5/2002 | Oda et al. ................... 313/504 |
| 6,403,289 B1 | 6/2002 | Tanaka et al. |
| 6,406,804 B1 | 6/2002 | Higashi et al. |
| 6,420,834 B2 | 7/2002 | Yamazaki et al. |
| 6,432,845 B1 | 8/2002 | Morozumi |
| 6,433,487 B1 | 8/2002 | Yamazaki et al. |
| 6,441,873 B2 | 8/2002 | Young |
| 6,445,005 B1 | 9/2002 | Yamazaki et al. |
| 6,462,722 B1 | 10/2002 | Kimura et al. |
| 6,475,836 B1 | 11/2002 | Suzawa et al. |
| 6,501,217 B2 | 12/2002 | Beierlein et al. |
| 6,515,310 B2 | 2/2003 | Yamazaki et al. ............. 257/98 |
| 6,518,700 B1 * | 2/2003 | Friend et al. ................ 313/504 |
| 6,522,315 B2 | 2/2003 | Ozawa et al. |
| 6,538,374 B2 | 3/2003 | Hosokawa |
| 6,538,390 B2 | 3/2003 | Fujita et al. .............. 315/169.3 |
| 6,552,496 B2 | 4/2003 | Yamazaki |
| 6,555,968 B2 | 4/2003 | Yamazaki et al. |
| 6,597,111 B2 * | 7/2003 | Silvernail et al. ........... 313/506 |
| 6,597,121 B2 | 7/2003 | Imura |
| 6,599,783 B2 | 7/2003 | Takatoku .................... 438/148 |
| 6,605,826 B2 | 8/2003 | Yamazaki et al. ............. 257/72 |
| 6,608,353 B2 | 8/2003 | Miyazaki et al. |
| 6,608,449 B2 | 8/2003 | Fukunaga |
| 6,614,085 B2 | 9/2003 | Hu |
| 6,624,571 B1 | 9/2003 | Toyoyasu et al. |
| 6,628,065 B2 | 9/2003 | Araki et al. |
| 6,641,933 B1 | 11/2003 | Yamazaki et al. |
| 6,690,034 B2 | 2/2004 | Fujimoto et al. |
| 6,692,845 B2 | 2/2004 | Maruyama et al. .......... 428/690 |
| 6,699,739 B2 | 3/2004 | Yamazaki et al. .......... 438/156 |
| 6,717,181 B2 | 4/2004 | Murakami et al. |
| 6,720,572 B1 | 4/2004 | Jackson et al. ................ 257/40 |
| 6,737,306 B2 | 5/2004 | Yamazaki et al. |
| 6,739,931 B2 | 5/2004 | Yamazaki et al. |
| 6,740,457 B2 | 5/2004 | Takizawa |
| 6,750,618 B2 | 6/2004 | Yamazaki et al. |
| 6,768,534 B2 * | 7/2004 | Iwase et al. ................. 349/153 |
| 6,774,573 B2 | 8/2004 | Yamazaki |
| 6,787,796 B2 | 9/2004 | Do et al. |
| 6,788,356 B2 | 9/2004 | Song |
| 6,798,132 B2 | 9/2004 | Satake et al. |
| 6,805,977 B2 * | 10/2004 | Sotoyama et al. ........... 428/690 |
| 6,831,408 B2 | 12/2004 | Hirano et al. |
| 6,839,045 B2 | 1/2005 | Ozawa et al. |
| 6,853,130 B2 | 2/2005 | Morii |
| 6,858,878 B2 | 2/2005 | Yamazaki et al. ............. 257/98 |
| 6,869,635 B2 | 3/2005 | Kobayashi |
| 6,881,501 B2 | 4/2005 | Yudasaka |
| 6,894,312 B2 | 5/2005 | Yamazaki et al. |
| 6,933,672 B2 | 8/2005 | Hosokawa |
| 6,956,324 B2 | 10/2005 | Yamazaki |
| 6,958,490 B2 | 10/2005 | Okamoto et al. |
| 6,977,463 B2 | 12/2005 | Sato |
| 6,995,511 B2 | 2/2006 | Yamazaki et al. |
| 7,015,503 B2 | 3/2006 | Seki et al. |
| 7,098,602 B2 | 8/2006 | Yamazaki et al. |
| 7,112,374 B2 | 9/2006 | Yamazaki et al. |
| 7,138,762 B2 | 11/2006 | Morii |
| 7,180,483 B2 | 2/2007 | Kimura et al. |
| 7,187,121 B2 | 3/2007 | Hasegawa et al. |
| 7,190,111 B2 | 3/2007 | Lee et al. |
| 7,214,959 B2 | 5/2007 | Seki et al. |
| 7,221,339 B2 | 5/2007 | Ozawa et al. |
| 7,253,793 B2 | 8/2007 | Ozawa et al. |
| 7,273,801 B2 | 9/2007 | Seki et al. |
| 7,332,859 B2 | 2/2008 | Hasegawa at al. |
| 7,358,531 B2 | 4/2008 | Koyama |
| 2001/0011868 A1 | 8/2001 | Fukunaga et al. ........... 313/506 |
| 2001/0013913 A1 | 8/2001 | Young |
| 2001/0020922 A1 | 9/2001 | Yamazaki et al. ............. 345/45 |
| 2001/0026125 A1 | 10/2001 | Yamazaki et al. |
| 2001/0046003 A1 | 11/2001 | Song |
| 2001/0054867 A1 | 12/2001 | Kubota ....................... 313/504 |
| 2002/0011597 A1 | 1/2002 | Fujimoto et al. |
| 2002/0025643 A1 | 2/2002 | Akram et al. |
| 2002/0039730 A1 | 4/2002 | Morii ........................... 435/6 |
| 2002/0043932 A1 | 4/2002 | Kawashima ................ 313/512 |
| 2002/0050795 A1 | 5/2002 | Imura ...................... 315/169.3 |
| 2002/0063287 A1 | 5/2002 | Yamazaki et al. |
| 2002/0063515 A1 | 5/2002 | Goto .......................... 313/500 |
| 2002/0121860 A1 | 9/2002 | Seo et al. |
| 2003/0062826 A1 | 4/2003 | Seo et al. ..................... 313/504 |
| 2003/0197466 A1 | 10/2003 | Yamazaki et al. ........... 313/504 |
| 2003/0201447 A1 | 10/2003 | Yamazaki et al. ............. 257/79 |
| 2003/0201716 A1 | 10/2003 | Yamazaki et al. ........... 313/506 |
| 2003/0227021 A1 | 12/2003 | Yamazaki et al. ............. 257/83 |
| 2003/0231273 A1 | 12/2003 | Kimura et al. |
| 2004/0012747 A1 | 1/2004 | Yamazaki et al. ........... 349/153 |
| 2004/0171182 A1 | 9/2004 | Yamazaki et al. ............. 438/22 |
| 2004/0195964 A1 | 10/2004 | Yamazaki et al. |
| 2005/0001541 A1 | 1/2005 | Yamazaki et al. ........... 313/503 |
| 2005/0006667 A1 | 1/2005 | Yamazaki |
| 2005/0012445 A1 | 1/2005 | Yamazaki et al. ........... 313/500 |
| 2005/0134171 A1 | 6/2005 | Kobayashi |
| 2005/0162092 A1 | 7/2005 | Yamazaki et al. |
| 2005/0186403 A1 | 8/2005 | Seki et al. |
| 2005/0247938 A1 | 11/2005 | Okamoto et al. |
| 2005/0248266 A1 | 11/2005 | Hosokawa |
| 2006/0014465 A1 | 1/2006 | Yamazaki |
| 2006/0017374 A1 | 1/2006 | Hasegawa et al. |
| 2006/0082300 A1 | 4/2006 | Yamazaki et al. |
| 2006/0267030 A1 | 11/2006 | Yamazaki et al. |
| 2006/0273995 A1 | 12/2006 | Ozawa et al. |
| 2006/0273996 A1 | 12/2006 | Ozawa et al. |
| 2006/0279491 A1 | 12/2006 | Ozawa et al. |
| 2007/0007870 A1 | 1/2007 | Yamazaki et al. |
| 2007/0096641 A1 | 5/2007 | Hasegawa et al. |
| 2008/0252207 A1 | 10/2008 | Yamazaki et al. |

FOREIGN PATENT DOCUMENTS

| | | |
|---|---|---|
| EP | 0781075 A1 | 6/1997 |
| EP | 0 895 219 A1 | 2/1999 |
| EP | 0 917 127 A1 | 5/1999 |
| EP | 0 989 778 A1 | 3/2000 |
| EP | 1022931 | 7/2000 |
| EP | 1065723 A2 | 1/2001 |
| EP | 1 085 576 A2 | 3/2001 |
| EP | 1 087 448 A2 | 3/2001 |
| EP | 1191820 | 3/2002 |
| EP | 1191823 | 3/2002 |
| EP | 1 255 240 A1 | 11/2002 |
| EP | 1 336 953 A2 | 8/2003 |
| EP | 1 337 131 A2 | 8/2003 |
| EP | 1 359 789 A1 | 11/2003 |
| EP | 1 363 265 A2 | 11/2003 |
| EP | 1 619 654 A1 | 1/2006 |
| EP | 1 793 650 A2 | 6/2007 |
| EP | 1 830 342 A2 | 9/2007 |
| EP | 1 830 343 A2 | 9/2007 |
| EP | 1 830 344 A2 | 9/2007 |
| JP | 10-289784 | 10/1998 |
| JP | 11-329741 | 11/1999 |

| | | |
|---|---|---|
| JP | 11-339970 | 12/1999 |
| JP | 2000-21566 | 1/2000 |
| JP | 2000-077181 | 3/2000 |
| JP | 2000-91083 | 3/2000 |
| JP | 2000-193994 | 7/2000 |
| JP | 2000269473 A * | 9/2000 |
| JP | 2000-353594 | 12/2000 |
| JP | 2001-43981 | 2/2001 |
| JP | 2001-52870 | 2/2001 |
| JP | 2001-076868 | 3/2001 |
| JP | 2001-154001 | 6/2001 |
| JP | 2001-214159 | 8/2001 |
| JP | 2001-217072 | 8/2001 |
| JP | 2001-230086 | 8/2001 |
| JP | 2001-338771 | 12/2001 |
| JP | 2001-351787 | 12/2001 |
| JP | 2002-8566 | 1/2002 |
| JP | 2002-015860 | 1/2002 |
| JP | 2002-504739 | 2/2002 |
| JP | 2002-71902 | 3/2002 |
| JP | 2002-131506 | 5/2002 |
| JP | 2002-132186 | 5/2002 |
| JP | 2002-198182 | 7/2002 |
| JP | 2002-208491 | 7/2002 |
| JP | 2002-352963 | 12/2002 |
| JP | 2003-017272 | 1/2003 |
| JP | 2003-017272 A | 1/2003 |
| JP | 2003-017273 | 1/2003 |
| JP | 2003-303684 | 10/2003 |
| JP | 2004-31324 | 1/2004 |
| WO | WO 98/36407 A1 | 8/1998 |
| WO | WO-99/39393 | 8/1999 |
| WO | WO 99/43028 A1 | 8/1999 |
| WO | WO 99/48339 A1 | 9/1999 |
| WO | WO 01/08240 | 2/2001 |
| WO | WO-01/63975 | 8/2001 |

OTHER PUBLICATIONS

U.S. Appl. No. 10/419,640 (pending) to Yamazaki et al filed Apr. 21, 2003, including specification, abstract, claims, drawings and PTO filing receipt.

U.S. Appl. No. 10/421,238 (pending) to Yamazaki et al filed Apr. 23, 2003, including specification, abstract, claims, drawings and PTO filing receipt.

U.S. Appl. No. 10/422,380 (pending) to Yamazaki et al filed Apr. 24, 2003, including specification, abstract, claims, drawings and PTO filing receipt.

U.S. Appl. No. 10/454,124 (pending) to Yamazaki et al filed Jun. 4, 2003, including specification, abstract, claims and drawings.

Office Action concerning U.S. Appl. No. 10/422,380, mailed on Nov. 12, 2004.

PTO filing receipt and pending claims (as of Oct. 21, 2005) for U.S. Appl. No. 10/379,123, to Yamazaki et al.

PTO filing receipt and pending claims (as of Aug. 25, 2005) for U.S. Appl. No. 10/419,640, to Yamazaki et al.

PTO filing receipt and pending claims (as of Sep. 9, 2005) for U.S. Appl. No. 10/421,238, to Yamazaki et al.

PTO filing receipt and pending claims (as of Apr. 6, 2006) for U.S. Appl. No. 10/422,380, to Yamazaki et al.

PTO filing receipt and pending claims (as of May 22, 2006) for U.S. Appl. No. 10/454,124, to Yamazaki et al.

Kamins T., Polycrystalline Silicon For Integrated Circuits and Displays, Vol. Second Edition, pp. 301, 302.

Merriam-Webster's Collegiate Dictionary, Vol. Tenth Edition, pp. 827.

Merriam-Webster's Collegiate Dictionary, Vol. Tenth Edition, pp. 653.

Pending Claims for U.S. Appl. No. 10/419,640 to Yamazaki et al.

Kamins T., Polycrystalline Silicon For Integrated Circuits and Displays, Vol. Second Edition, Jan. 1, 1998, pp. 301, 302.

Merriam-Webster's Collegiate Dictionary, Vol. Tenth Edition, Jan. 1, 1998, pp. 827.

Merriam-Webster's Collegiate Dictionary, Vol. Tenth Edition, Jan. 1, 1998, pp. 653.

* cited by examiner light emitting region    60

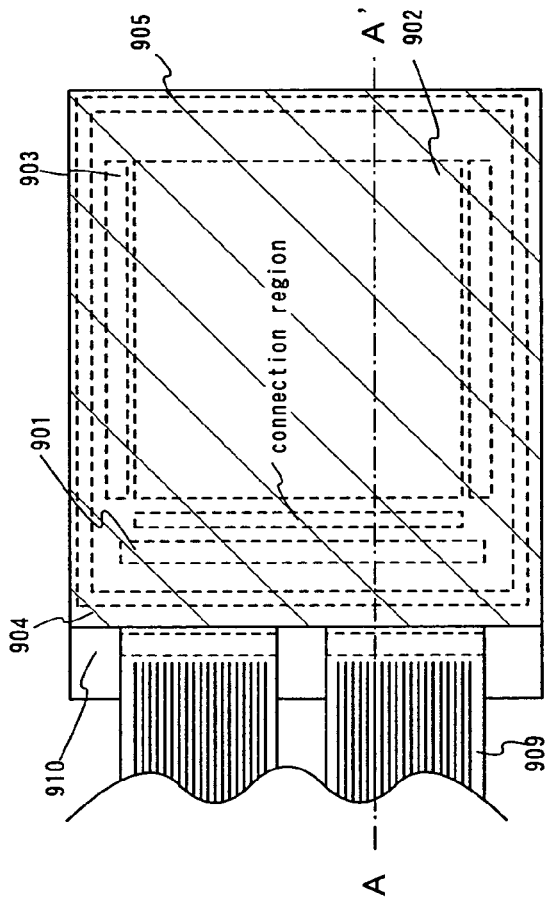
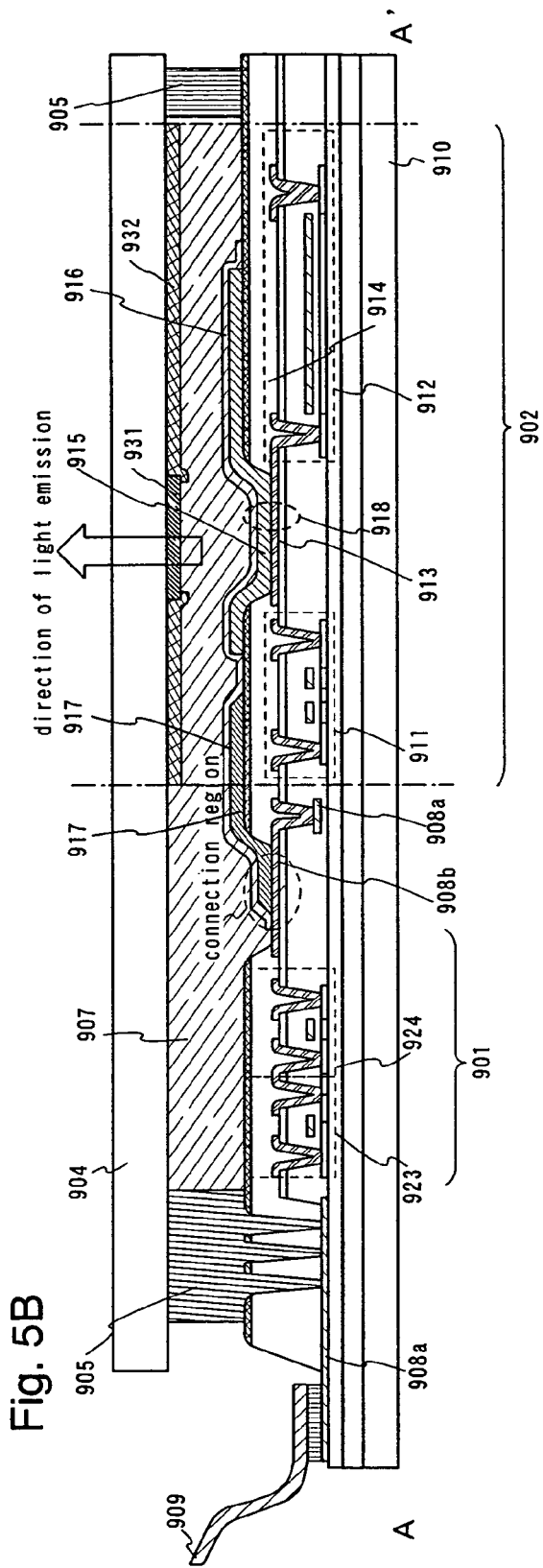
Fig. 5A
Fig. 5B

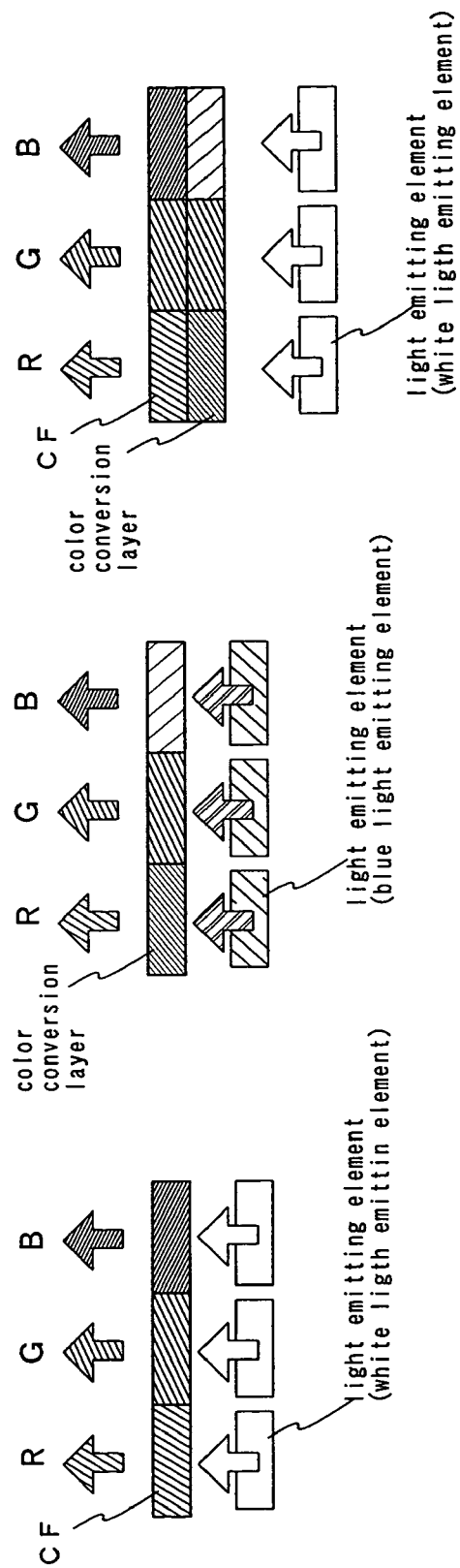

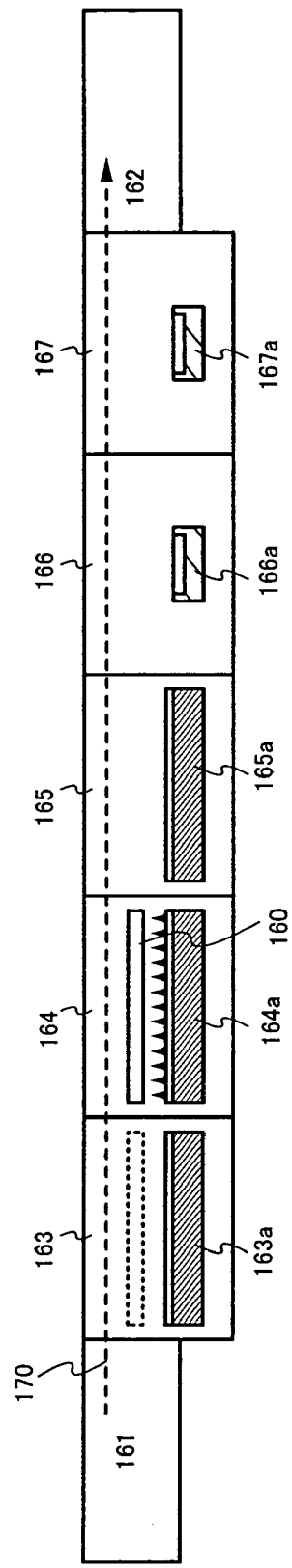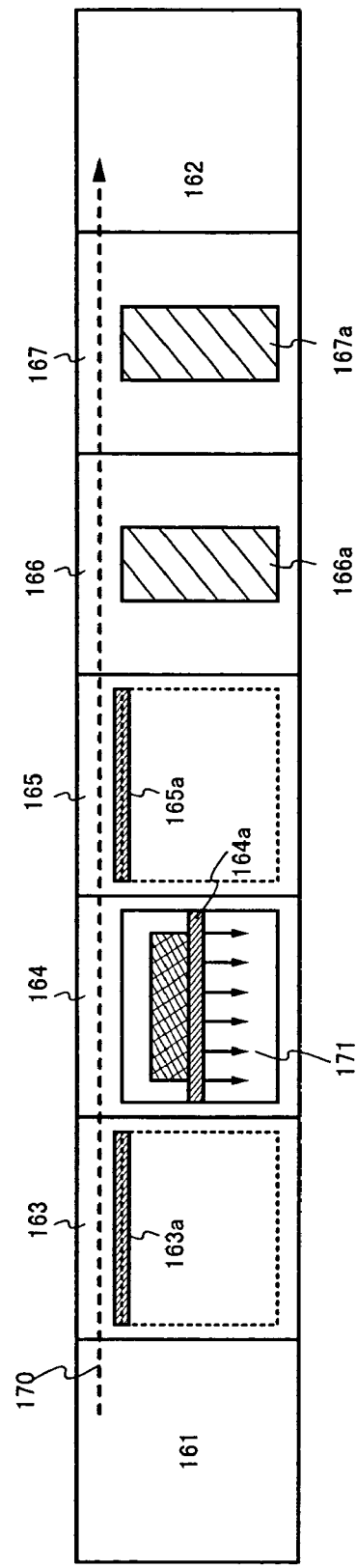

LIGHT EMITTING DEVICE AND METHOD OF MANUFACTURING THE SAME

BACKGROUND OF THE INVENTION

1. Field of the Invention

The present invention relates to a light emitting device with a light emitting element that emits fluorescent light or phosphorescent light upon application of electric field to a pair of electrodes of the element which sandwich an organic compound-containing layer, and to a method of manufacturing the light emitting device. In this specification, the term light emitting device includes an image display device, a light emitting device and a light source (including illuminating device). Also, the following modules are included in the definition of the light emitting device: a module obtained by attaching to a light emitting element a connector such as an FPC (flexible printed circuit; terminal portion), a TAB (tape automated bonding) tape, or a TCP (tape carrier package); a module in which a printed wiring board is provided at an end of the TAB tape or the TCP; and a module in which an IC (integrated circuit) is directly mounted to a light emitting element by the COG (chip on glass) system.

In addition, a semiconductor device referred to in the specification of the present application indicates devices in general making use of semiconductor characteristics to be able to function, and electro-optic devices, semiconductor circuits, and electronic apparatuses are all included in the semiconductor device.

2. Description of the Related Art

Light emitting elements, which employ organic compounds as light emitting members and are characterized by their thinness and light weight, fast response, and direct current low voltage driving, are expected to develop into next-generation flat panel displays. Among display devices, ones having light emitting elements arranged to form a matrix shape are considered to be particularly superior to the conventional liquid crystal display devices for their wide viewing angle and excellent visibility.

It is said that light emitting elements emit light through the following mechanism: a voltage is applied between a pair of electrodes that sandwich an layer containing an organic compound, electrons injected from the cathode and holes injected from the anode are re-combined at the luminescent center of the organic compound-containing layer to form molecular excitons, and the molecular excitons return to the base state while releasing energy to cause the light emitting element to emit light. Known as excitation states are singlet excitation and triplet excitation, and it is considered that luminescence can be conducted through either one of those excitation states.

Such light emitting devices having light emitting elements arranged to form a matrix can employ passive matrix driving (simple matrix light emitting devices), active matrix driving (active matrix light emitting devices), or other driving methods. However, if the pixel density is increased, active matrix light emitting devices in which each pixel (or each dot) has a switch are considered as advantageous because they can be driven with low voltage.

Organic compounds for forming an layer containing an organic compound (strictly speaking, light emitting layer), which is the center of a light emitting element, are classified into low molecular weight materials and polymeric (polymer) materials. Both types of materials are being studied but polymeric materials are the ones that are attracting attention because they are easier to handle and have higher heat resistance than low molecular weight materials.

The conventional light emitting device has the structure comprising a light emitting element in which an electrode electrically connected with a TFT on a substrate is formed as an anode, an organic compound layer is formed thereon, and a cathode is formed thereon. And light generated at the organic compound layer can be observed at the TFT side through the anode that is a transparent electrode. There has been a problem in the structure that an opening ratio is restricted depending on an arrangement of TFTs and wirings in a pixel portion when definition is to be improved.

Alternatively, a structure (hereafter is referred as top emission structure) is given in which an anode is formed as an electrode, an organic compound-containing layer is formed on the anode, and a cathode serving as a transparent electrode is formed on the layer containing organic.

In an top emission structure, there has been a problem in that a wiring, a TFT, or the like is provided in regions other than a light emitting region so that light reflected by the wiring reaches eyes of an observer.

SUMMARY OF THE INVENTION

The present invention provides a light emitting device having a structure capable of solving the above-mentioned problems, as well as a method for manufacturing the light emitting device.

The present invention prevents light that is reflected by a wire from reaching eyes of an observer by providing a light-absorbing multilayer film in regions other than a light emitting region. Specifically, the light-absorbing multilayer film is used as an upper layer of a partition wall (also called as a bank or a barrier) that covers ends of a first electrode whereas an organic resin film is used as a lower layer of the partition wall. The partition wall in the present invention is characterized by being a laminate of three or more layers formed of different materials.

The light-absorbing multilayer film may be formed, for example, by laminating a silicon nitride film, a metal nitride film (typically, titanium nitride film, tantalum nitride film, etc.) and a silicon nitride film each at an appropriate film thickness on a metal layer of high reflectance (typically, metal layer comprising aluminum as a main component) and, when external light is incident, it is decreased by optical interference absorption caused between each of the layers. The region where the light-absorbing multilayer film is disposed does not overlap with the emitted light region.

Further, since the multilayer film, which absorbs the above-described light disposed at the top of the TFTs, can prevent the irradiation of outside light, therefor can prevent the deterioration caused by the irradiation from the outside light to the TFTs.

The constitution of the invention disclosed in the present specification provides a light emitting device comprising:

a first electrode connected to a thin film transistor on a substrate that has an insulating surface;

a partition wall covering ends of the first electrode;

a layer which contains an organic compound and which is in contact with the top of the first electrode; and a second electrode that is in contact with the top of the layer, wherein the partition wall is a laminate of an organic resin layer and a light-absorbing multilayer film.

In each of the constitutions described above, the partition wall covers other regions than a light emitting region in which the first electrode and the organic compound-containing layer are in contact with each other and laid on top of each other. Note that the partition wall is not formed at a part which connects the second electrode with a wiring of a lower layer, and terminals which connect an FPC. When a driving circuit is formed on the same substrate, a laminate same as the partition wall covering the driving circuit may be optionally provided. However, in the pixel portion, the partition wall covers other regions than a light emitting region where becomes a display region.

Further, in each of the constitutions described above, the light-absorbing multilayer film disposed on the upper layer of the partition wall covered with the insulator contains at least one layer of a light transmitting nitride insulation film. Specifically, the light-absorbing multilayer film disposed on the upper layer of the partition wall at least has a four-layered structure comprising a reflective metal film, a light transmissive film, a film partially absorbing light and a light transmissive film, in which the light transmissive film contains at least one layer comprising $Al_2O_3$, $SiO_2$, $ZrO_2$, $HfO_2$, $Sc_2O_3$, $TiO_2$, ITO or ZnO.

Alternatively, in each of the constitutions described above, the light-absorbing multilayer film formed on the reflective metal film may be a light-absorbing multilayer film containing at least one layer of a light transmitting nitride insulation film. The reflectance can be reduced to 5% or less by using a laminate comprising a film containing aluminum as main component, a silicon nitride film, a titanium nitride film and a silicon nitride film. A multilayer film using nitride insulating film or a nitride metal film can function as a blocking layer against oxygen and moisture, and therefor can suppress the deterioration of EL elements. Similar effect can also be obtained by using a brown or black metal film such as a tantalum nitride film instead of titanium nitride.

Further, in each of the constitutions described above, other films partially absorbing light may be a film containing at least one layer comprising Al, Cu, Au, Mo, Ni, Pt, Rh, Ag, W, Cr, Co, Si, Zr, Ta, Inconel or Nichrome.

Further, in each of the constitutions described above, the second electrode is a conductive film transmissive of light, such as a thin metal film, a transparent conductive film, or a laminate thereof.

Further, each of the constitutions described above provides a light emitting device in which the layer containing the organic compound is made of a material that emits white light and combined with a color filter disposed to a sealant or a light emitting device in which the layer containing the organic compound is made of a material that emits a monochromatic light combined with a color conversion layer or a coloring layer disposed to the sealant. Further, layers containing different organic compounds can be formed respectively in each pixel to obtain each luminescence of red, green and blue (RGB), in this case, a color filter is not specially required.

The above structures are characterized in that the first electrode is an anode whereas the second electrode is a cathode. Alternatively, the above structures are characterized in that the first electrode is a cathode whereas the second electrode is an anode.

Further, in accordance with the invention, auxiliary wirings (also referred to as auxiliary wirings or a third electrode) by evaporation using an evaporation mask may be formed on the partition wall disposed between each of the pixel electrodes to lower the film resistance of the second electrode as a cathode (light transmitting electrode). Further, it is also a feature of the invention to form lead wirings by using the auxiliary wirings and conduct connection with other wirings present in the lower layer.

The above structures are characterized in that the first electrode may be a concave shape. When the first electrode is formed in a self-aligning manner using the partition wall as a mask, accordingly, there is no need for a new mask to form the first electrode shape. The stepped portion (the upper edge portion of the slope portion) of the first electrode is almost flush with a side face of the insulator and, in order to cover the level difference well, it is preferable for the slope of the first electrode and the side face of the insulator to have the same angle of inclination. Further, the inclined surface formed in the first electrode prevents emitted light from the light emitting device (also including emitted light in the lateral direction) from reaching a TFT. When the first electrode is designed to be a concave shape, the first electrode has an inclined surface directing to the central portion of the first electrode and the angle of inclination (also referred to as a tapered angle) is larger than 50° and smaller than 60° and, more preferably, 54.7°. It is necessary that the angle of inclination, the material and the thickness of the layer containing the organic compound, or the material and the thickness of the second electrode are properly selected such that the light reflected on the inclined surface of the first electrode is not dispersed between layers or does not form stray light.

Further, the constitution of the invention for attaining each of the constitutions described above provides a method of manufacturing a light emitting device with a light emitting element, the light emitting element having an anode, an organic compound-containing layer that is in contact with the anode, and a cathode that is in contact with the organic compound-containing layer, comprising:
   forming a laminate of an insulating film and a light-absorbing multilayer film on a first electrode that is formed from a metal film;
   selectively etching the laminate of the insulating film and the light-absorbing multilayer film to form a partition wall that covers ends of the first electrode;
   forming an organic compound-containing film; and
   forming on the organic compound-containing film a second electrode from a metal thin film that transmits light.

In according to the constitutions of the above-described manufacturing method, the insulating film is an inorganic insulating film or an organic resin film.

In according to the constitutions of the above-described manufacturing method, the first electrode is an anode and is formed from a metal layer that is larger in work function than the second electrode.

In according to the constitutions of the above-described manufacturing method, at least one layer out of the layers of the light-absorbing multilayer film is a reflective metal film.

In according to the constitutions of the above-described manufacturing method, at least one layer out of the layers of the light-absorbing multilayer film is formed of $Al_2O_3$, $SiO_2$, $ZrO_2$, $HfO_2$, $Sc_2O_3$, $TiO_2$, ITO, or ZnO.

In according to the constitutions of the above-described manufacturing method, at least one layer out of the layers of the light-absorbing multilayer film is a light-transmissive, insulating, nitride film.

In according to the constitutions of the above-described manufacturing method, at least one layer out of the layers of the light-absorbing multilayer film is formed of Ti, Al, Cu, Au, Mo, Ni, Pt, Rh, Ag, W, Cr, Co, Si, Zr, Ta, Inconel, or Nichrome.

An EL element has an organic compound-containing layer that provides luminescence upon application of electric field (electro luminescence)(hereinafter referred to as EL layer), in addition to an anode and a cathode. Luminescence obtained from organic compounds is divided into light emission upon return to the base state from singlet excitation (fluorescence) and light emission upon return to the base state from triplet excitation (phosphorescence). Both types of light emission can be employed in a light emitting device manufactured in accordance with the present invention.

A light emitting element having an EL layer (EL element) is structured so as to sandwich the EL layer between a pair of electrodes. Usually, the EL layer has a laminate structure. A typical example of the laminate structure is one consisting of a hole transporting layer, a light emitting layer, and an electron transporting layer. This structure has very high light emission efficiency and is employed in most of light emitting devices that are currently under development.

Other examples of the laminate structure include one in which a hole injection layer, a hole transporting layer, a light emitting layer, and an electron transporting layer are layered on an anode in this order, and one in which a hole injection layer, a hole transporting layer, a light emitting layer, an electron transporting layer, and an electron injection layer are layered on an anode in this order. The light emitting layer may be doped with a fluorescent pigment or the like. These layers may all be formed of low molecular weight materials or may all be formed of high molecular weight materials. In this specification, all layers placed between an anode and a cathode together make an EL layer. Accordingly, the above hole injection layer, hole transporting layer, light emitting layer, electron transporting layer, and electron injection layer are included in an EL layer.

In a light emitting device of the present invention, how screen display is driven is not particularly limited. For example, a dot-sequential driving method, a linear-sequential driving method, a plane-sequential driving method or the like can be employed. Typically, a linear-sequential driving method is employed and a time ratio gray scale driving method or an area ratio gray scale driving method is chosen suitably. A video signal inputted to a source line of the light emitting device may be an analog signal or a digital signal, and driving circuits and other circuits are designed in accordance with the type of the video signal as appropriate.

BRIEF DESCRIPTION OF THE DRAWINGS

In the accompanying drawings:

FIGS. 5A and 5B are diagrams showing Embodiment 2;

FIGS. 6A to 6C are diagrams showing Embodiment Mode 2;

FIGS. 9A and 9B are diagrams showing an example of a manufacturing apparatus (Embodiment 3);

DETAILED DESCRIPTION OF THE PREFERRED EMBODIMENTS

Embodiment Modes of the present invention will be described below.

Figure 1A:
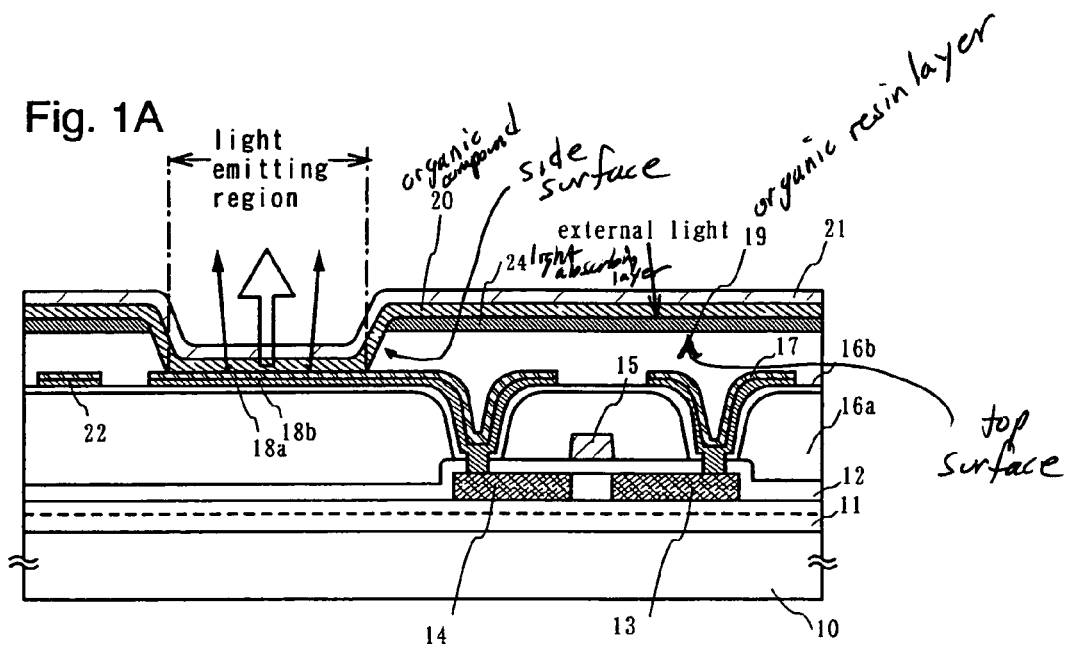
FIGS. 1A and 1B are diagrams showing Embodiment Mode 1.

FIG. 1A is a sectional view of an active matrix light emitting device (a part of one pixel). Described here as an example is a light emitting element which uses as its light emitting layer an organic compound-containing layer formed of a high molecular weight material that emits white light.

In FIG. 1A, a TFT (p-channel TFT) on a substrate 10 having an insulating surface is an element for controlling a current flowing into an EL layer 20 that emits white light. Of regions denoted by reference symbols 13 and 14, one is a source region and the other is a drain region. A base insulating film 11 (here a laminate of an insulating nitride film as a lower layer and an insulating oxide film as an upper layer) is formed on the substrate 10. A gate insulating film 12 is placed between a gate electrode 15 and an active layer of the TFT. Denoted by reference symbol 16a is an interlayer insulating film formed of an organic material or an inorganic material. Reference symbol 16b represents a protective film formed of silicon nitride, silicon nitroxide, aluminum nitride, or aluminum nitroxide. Although not shown in the drawing, one pixel has another or more TFTs (n-channel TFTs or p-channel TFTs) other than this TFT. The TFT here has one channel formation region. However, the number of channel formation regions is not particularly limited, and the TFT may have more than one channels.

Denoted by reference symbols 18a and 18b are a first electrode, namely, an anode (or a cathode) of the OLED. Reference symbol 21 denotes a second electrode formed from a conductive film, namely, a cathode (or an anode) of the OLED. The region that actually functions as the anode is the region 18b. Here, a titanium film as 18a and a titanium nitride film as 18b are formed and layered in this order, and the film 18b which is in contact with an organic compound-containing layer 20 functions as the anode. When using a titanium nitride film as an anode, work function of the film is desirably increased by subjecting its surface to UV light or plasma treatment. Other materials that can be used for the first electrode 18b are ones that have large work function when formed into thin films (Pt, Cr, W, Ni, Zn, Sn), and the thickness of such thin films is 10 to 100 nm. Although the first electrode in the example shown here has two layers, there is no particular limitation. The first electrode may be a single layer or may be a laminate of three or more layers with a blocking layer for preventing alloying interposed between two adjacent layers.

A power supplying line 17 has the same laminate structure as the first electrode. At the same time, a source wire 22 and others are formed. In the example shown here, the source wire, the first electrode, and the power supplying line are on the same layer in order to shorten the process. Alternatively, one more interlayer insulating film may be added to form the first electrode on a layer different from the one on which the source wire and the power supplying line are formed. When formed on a layer different from the one for the source wire and the power supplying line, the first electrode can have a large area, and therefore, the light emitting region is enlarged. If in this case the source wire and the power supplying line are formed of a material having low electric resistivity, for example, a material mainly containing aluminum, low-resistant wiring is obtained.

To obtain the emission of white light, an aqueous solution of poly(ethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the entire surface and baked to form a film that works as a light emitting layer The solvent of PEDOT/PSS is water and PEDOT/PSS is not dissolved in an organic solvent. Accordingly, the hole injection layer does not go back to the melted state even if PVK is applied thereon. Since PEDOT/PSS and PVK have different solvents, they are preferably formed into films in different film forming chambers. The organic compound-containing layer 20 may instead be a single layer. In this case, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts.

Alternatively, a combination of films is chosen appropriately from a film containing an organic compound that emits red light, a film containing an organic compound that emits green light, and a film containing an organic compound that emits blue light to overlap each other and mix their colors, thereby obtaining white light emission.

For the second electrode 21, a $CaF_2$ film is formed by evaporation to have a thickness of 1 to 10 nm and then an Al film is formed by sputtering or evaporation to have a thickness of about 10 nm to function as the cathode. The material and thickness of the cathode have to be chosen suitably to transmit light from the organic compound-containing layer 20. In this specification, the term cathode includes not only a single layer of a material having a small work function but also a laminate of a thin film of a small work function material and a conductive film.

Using an Al film as the second electrode 21 means that a material that is not an oxide comes into contact with the organic compound-containing layer 20. As a result, the reliability of the light emitting device is improved. Instead of an Al film, a transparent conductive film (such as an ITO (indium oxide-tin oxide alloy) film, an $In_2O_3$—ZnO (indium oxide-zing oxide alloy) film, or a ZnO (zinc oxide) film) may be employed as the second electrode 21. The $CaF_2$ layer may be replaced by a thin metal layer (typically a film of such alloy as MgAg, MgIn, or AlLi).

Figure 1B:
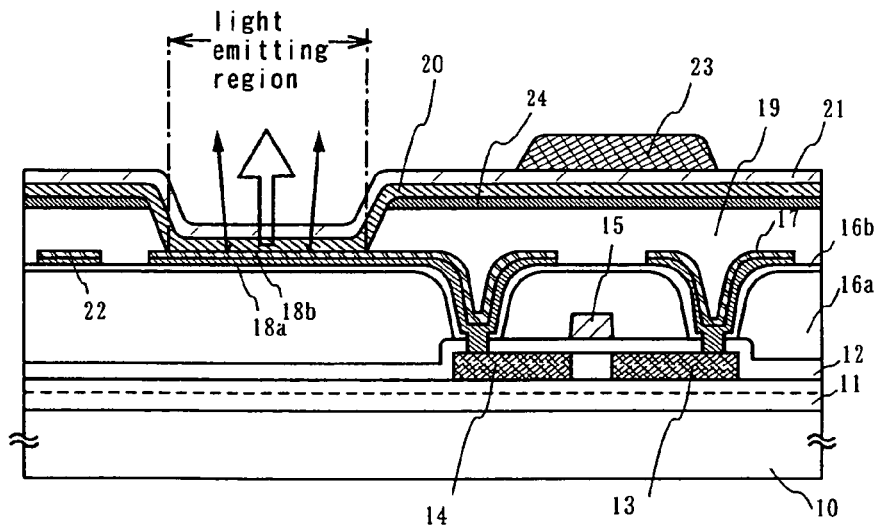

A partition wall (also called a barrier or a bank) covers the end portions of the first electrode 18 and the area between the end portions. In the present invention, the partition wall has functions of insulating the electrodes from each other and absorbing outside light. The insulating film 19 (inorganic insulating film or organic insulating film) serves as the lower layer of the partition wall and the light-absorbing multilayer film 24 serves as the upper layer thereof. Typically, the partition wall has a four-layer structure obtained by forming a reflective metal film, a light-transmissive film, a partially light absorbing film, and another light-transmissive film in order. The light-absorbing multilayer film 24 shown in FIGS. 1A and 1B is a single-layer film for the purpose of simplification, but actually there are four or more layers in the multilayer film 24.

Used as the reflective metal film is a film mainly containing Al or Ag. The light-transmissive films are layers formed of $Al_2O_3$, $SiO_2$, $ZrO_2$, $HfO_2$, $Sc_2O_3$, $TiO_2$, ITO, or ZnO. The partially light absorbing film is a layer formed of Al, Cu, Au, Mo, Ni, Pt, Rh, Ag, W, Cr, Co, Si, Zr, Ta, Inconel, or Nichrome.

In the description here, the multilayer film uses a film that contains nitrogen to absorb outside light in order to form the organic compound-containing layer in a later step. What follows is a simulation thereof.

Figure 7:
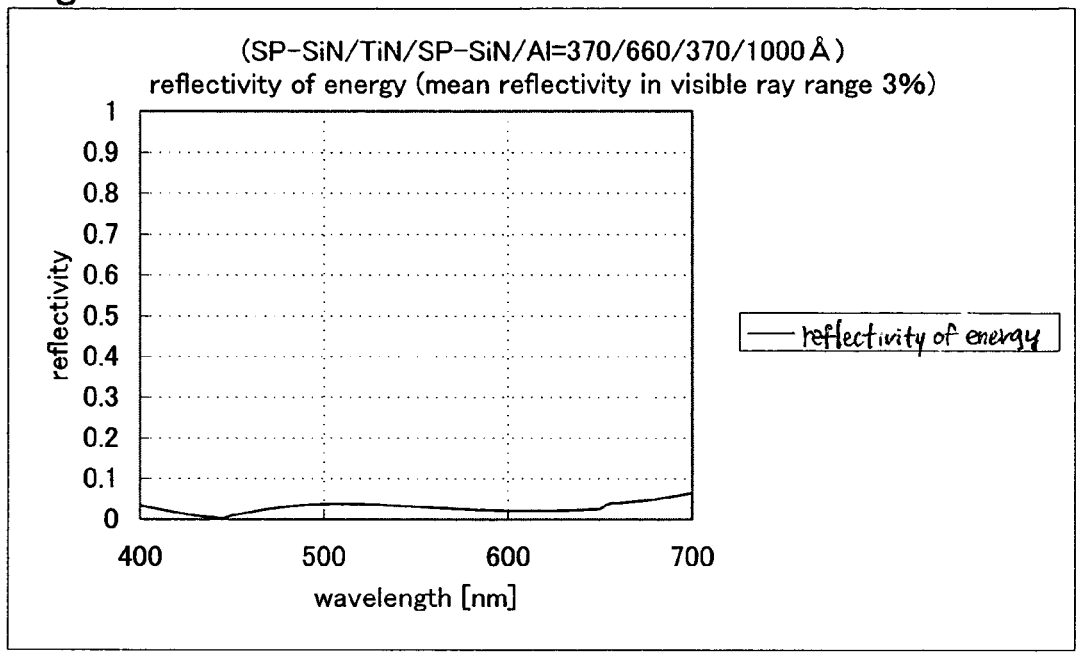
FIG. 7 is a graph showing simulation results of a light-absorbing multilayer film of the present invention.

A film mainly containing aluminum is formed as the reflective metal film to a thickness of 100 nm. On this film, a silicon nitride film (with a thickness of 37 nm) is formed by sputtering using a silicon target in an atmosphere containing nitrogen and argon. A titanium nitride film is formed on this silicon nitride film to a thickness of 66 nm. Then another silicon nitride film (with a thickness of 37 nm) is formed by sputtering using a silicon target in an atmosphere containing nitrogen and argon. The reflectivity of the thus obtained model structure has been measured, and the results are shown in FIG. 7. In the simulation, the silicon nitride films are given a refractive index of 2.04 to 2.2 in a wavelength range between 400 nm and 700 nm, whereas titanium nitride and aluminum in this wavelength range are given a refractive index of 1.67 to 2.35 and a refractive index of 0.39 to 1.985, respectively. The mean reflectivity in the visible ray range is 3%. The thicknesses of the films are not particularly limited and can be set suitably. The optimum film thickness varies depending on the material of the film.

Figure 8:
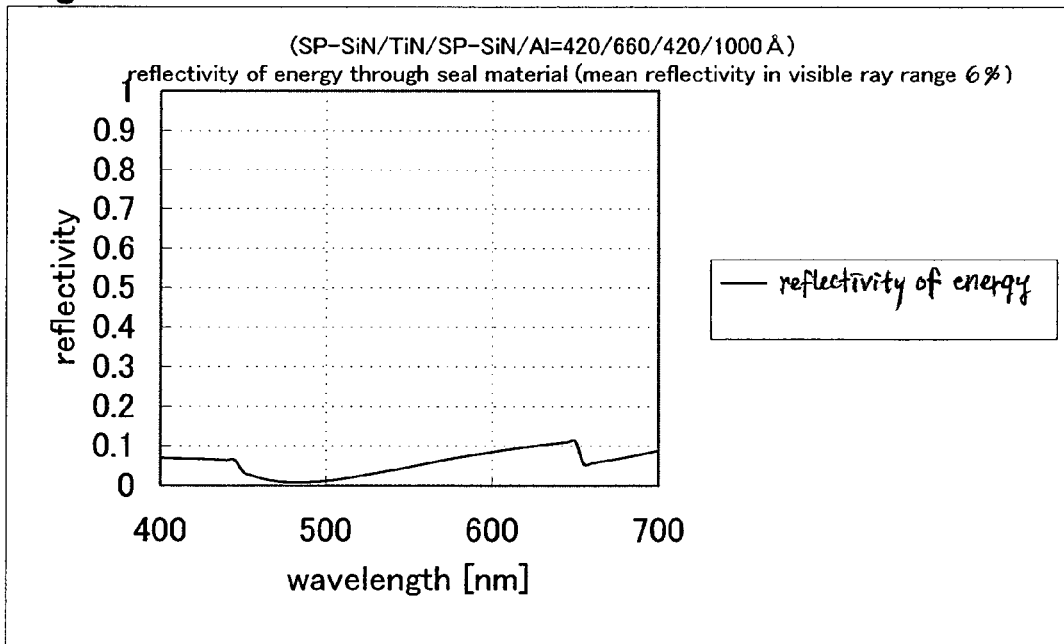
FIG. 8 is a graph showing simulation results of a light-absorbing multilayer film of the present invention.

The same simulation has been performed on a case where the conductive film 21 is covered with a seal material comprising a transparent resin, and the results are shown in FIG. 8. The reflectivity in FIG. 8 is slightly higher than in FIG. 7 but is 6% in average. When the conductive film 21 is covered with the seal material comprising a transparent resin, the optimum thickness is 42 nm for each of the silicon nitride films.

In the example shown here, a silicon nitride film, a titanium nitride film, and another silicon nitride film are layered in order on a reflective metal film. Instead, for example, a silicon nitride film, a tantalum nitride film, and another silicon nitride film may be layered in this order on a reflective metal film. Alternatively, layered in order on a reflective metal film may be a silicon nitride film, a titanium nitride film, and an ITO film. Forming on a reflective metal film a silicon nitride film, a titanium nitride film, and an ITO film sequentially is preferable because it increases process margin in later etching.

It is also possible to form the insulating film and the light absorbing layer in succession avoiding exposure to the air if all the layers of the multilayer film are formed of materials that can employ sputtering. When a nitride film is used in the light absorbing layer 24, the layer 24 also functions as a passivation film. Using a nitride film in the light absorbing layer 24 also makes it possible to block moisture and oxygen and therefore is suitable for a light emitting element that uses an organic compound-containing layer.

In order to give the organic compound-containing layer 20 and the conductive film 21 wider coverage, it is preferable to restrict the total thickness of the partition wall and to taper the side walls. One of the layers of the light-absorbing multilayer film is a reflective metal film which, although not shown in the drawings, is connected to the second electrode 21 to have the same electric potential.

As shown in FIG. 1B, an auxiliary electrode 23 may be provided on the conductive film 21 in order to lower the resistance of the conductive film (cathode) 21. The auxiliary electrode 23 is selectively formed by evaporation using an evaporation mask.

Although not shown in the drawing, a protective film is preferably formed on the second electrode 21 in order to enhance the reliability of the light emitting device. This protective film is an insulating film which mainly contains silicon nitride or silicon nitroxide and which is formed by sputtering (the DC method or the RF method), or a thin film mainly containing carbon. A silicon nitride film can be formed in an atmosphere containing nitrogen and argon using a silicon target. A silicon nitride target may be employed instead. The protective film may also be formed by film forming apparatus that uses remote plasma. The protective film is made as thin as possible to allow emitted light to pass through the protective film. Note that, when a material mainly composed of aluminum is used as a cathode, blocking property against oxygen or water is high.

The present invention is characterized in that the thin film mainly containing carbon is a DLC (diamond-like carbon) film with a thickness of 3 to 50 nm. In viewpoint of short-range order, a DLC film has $SP^3$ bonds as bonds between carbons. Macroscopically, a DLC film has an amorphous structure. 70 to 95 atomic % carbon and 5 to 30 atomic % hydrogen constitute a DLC film, giving the film high degree of hardness and excellent insulating ability. Such DLC film is characteristically low in transmittance of gas such as steam and oxygen. Also, it is known that the hardness of a DLC film is 15 to 25 GPa according to measurement by a microhardness tester.

A DLC film is formed by plasma CVD (typically, RF plasma CVD, microwave CVD, or electron cyclotron resonance (ECR) CVD) or sputtering. Any of the film formation methods can provide a DLC film with excellent adhesion. In forming a DLC film, the substrate is set as a cathode. Alternatively, a dense and hard DLC film is formed by applying negative bias and utilizing ion bombardment to a certain degree.

Reaction gas used to form the film are hydrogen gas and hydro carbon-based gas (for example, $CH_4$, $C_2H_2$, or $C_6H_6$) and are ionized by glow discharge. The ions are accelerated to collide against the cathode to which negative self-bias is applied. In this way, a dense, flat, and smooth DLC film is obtained. The DLC film is an insulating film transparent or translucent to visible light.

In this specification, being transparent to visible light means having a visible light transmittance of 80 to 100%, whereas being translucent to visible light means having a visible light transmittance of 50 to 80%.

Although not shown in the drawing, the last step is hermetic seal using a substrate for sealing an EL element and the seal material. The sealing substrate is bonded at a fixed distance of about 2 to 30 μm to hermetically seal all the light emitting elements. Preferably, the device is degassed by vacuum annealing immediately before the sealing substrate is bonded with the seal material. The seal material covers the entire surface so that all the light emitting elements are hermetically sealed without using a drying agent. On the other hand, if the sealing substrate is bonded in a manner that leaves a space between the substrates, it is preferable to form a concave portion in the sealing substrate by sand blasting or the like and to place a drying agent in the concave portion in an atmosphere containing inert gas (noble gas or nitrogen) before bonding.

The description given here takes a top gate TFT as an example. However, the present invention is applicable to any TFT structure. For instance, the invention can be applied to a bottom gate (reverse stagger) TFT and a forward stagger TFT.

Embodiment Mode 2

A method of combining a white color luminescent element and a color filter (hereinafter, referred to as color filter method) will be explained in reference to FIG. 6A as follows.

The color filter method is a system of forming a light emitting element having an layer containing an organic compound layer displaying white color luminescence and passing the provided white color luminescence through a color filter to thereby achieve luminescence of red, green, and blue.

Although there are various methods of achieving white color luminescence, a case of using a luminescent layer comprising a high molecular weight material formable by coating will be explained here. In this case, doping of a color pigment to the high molecular weight material for constituting a luminescent layer can be carried out by preparing a solution and can extremely easily be achieved in comparison with an evaporation method for carrying out common evaporation for doping a plurality of color pigments.

Specifically, after coating and baking an aqueous solution of poly (ethylenedioxythiophene)/poly(stylenesulfonic acid) (PEDOT/PSS) operated as a hole injecting layer over an entire face of an anode comprising a metal having large work function (Pt, Cr, W, Ni, Zn, Sn, In), thereafter coating and baking a polyvinyl carbazole (PVK) solution doped with a luminescent core pigment (1,1,4,4-tetraphenyl 1,3-butadience (TPB), 4-dicyanomethylene-2-methyl-6-(p-dimethylaminostyryl)-4H-pyran(DCM1), Nile red, coumarin 6 or the like) operating as the luminescent layer over the entire face, a cathode comprising a laminated layer of a thin film including metal having small work function (Li, Mg, Cs) and a transparent conductive film (ITO (indium oxide tin oxide alloy), indium oxide zinc oxide alloy ($In_2O_3$—ZnO), zinc oxide (ZnO) or the like) laminated thereabove is formed. Further, PEDOT/PSS uses water as a solvent and is not dissolved in an organic solvent. Therefore, even when PVK is coated thereabove, there is no concern of dissolving again. Further, kinds of solvents of PEDOT/PSS and PVK differ from each other and therefore, it is preferable that the same film forming chamber is not used therefor.

Further, although an example of laminating organic compound layers is shown in the above-described example, a single layer of an organic compound-containing layer can be constituted. For example, 1,3,4-oxadiazole derivative (PBD) having electron transporting performance may be dispersed in polyvinyl carbazole (PVK) having hole transporting performance. Further, white color luminescence is achieved by dispersing 30 wt % of PBD as an electron transporting agent and dispersing pertinent amounts of four kinds of color pigments (TPB, coumarin 6, DCM1, Nile red).

Further, the layer containing the organic compound layer is formed between the anode and the cathode and by recombining holes injected from the anode and electrons injected from the cathode at the layer containing the organic compound layer, white color luminescence is achieved in the layer containing the organic compound layer.

Further, it is also possible to achieve white color luminescence as a whole by pertinently selecting an layer containing an organic compound layer for carrying out red color luminescence, an layer containing an organic compound layer for carrying out green color luminescence, and an layer containing an organic compound layer for carrying out blue color luminescence, and laminating the films to mix color.

The layer containing the organic compound layer formed as described above can achieve white color luminescence as a whole.

By forming color filters respectively provided with the coloring layer (R) for absorbing other than red color luminescence, a coloring layer (G) for absorbing other than green color luminescence and the coloring layer (B) for absorbing other than blue color luminescence in a direction of carrying out white color luminescence by the layer containing the organic compound layer, white color luminescence from the light emitting element can respectively be separated to achieve red color luminescence, green color luminescence and blue color luminescence. Further, in the case of an active matrix type, a structure in which TFT is formed between the substrate and the color filter is constituted.

Further, starting from simplest stripe pattern, skewed mosaic alignment, triangular mosaic alignment, RGBG four pixels alignment or RGBW four pixels alignment can be used for the coloring layer (R, G, B).

A coloring layer for constituting a color filter is formed by using a color resist comprising an organic photosensitive material dispersed with a pigment. Further, chromaticity coordinates of white color luminescence are (x, y)=(0.34, 0.35). It is known that color reproducing performance as full color is sufficiently ensured.

Further, in this case, even when achieved luminescent color differs, the constitution is formed with all the layer containing the organic compound layers displaying white color luminescence and therefore, it is not necessary to form the layer containing the organic compound layer to coat to divide for each luminescent color. Further, a polarizer for a circularly polarized light for preventing mirror reflection is not particularly needed.

Next, a CCM (color changing mediums) method realized by combining a blue color light emitting element having a blue color luminescent organic compound film and a fluorescent color changing layer will be explained in reference to FIG. 6B.

According to the CCM method, the fluorescent color changing layer is excited by blue color luminescence emitted from the blue color luminescent element and color is changed by each color changing layer. Specifically, changing from blue color to red color by the color changing layer (B→R), changing from blue color to green color by the color changing layer (B→G) and changing from blue color to blue color by the color changing layer (B→B) (further, changing from blue color to blue color may not be carried out) are carried out to achieve red color, green color and blue color luminescence. Also in the case of the CCM method, the structure in which TFT is formed between the substrate and the color changing layer is constituted in the case of the active matrix type.

Further, also in this case, it is not necessary to form the layer containing the organic compound layers to coat to divide also in this case. Further, a polarizer for a circularly polarized light for preventing mirror reflection is not particularly needed.

Further, when the CCM method is used, since the color changing layer is florescent, the color changing layer is excited by external light and a problem of reducing contrast is posed and therefore, as shown by FIG. 6C, the contrast may be made conspicuous by mounting color filters. In this case, blue color luminescence is not necessary, instead, white color luminescence may be used.

Further, this embodiment mode can be combined with Embodiment Mode 1.

Embodiment Mode 3

Figure 3:
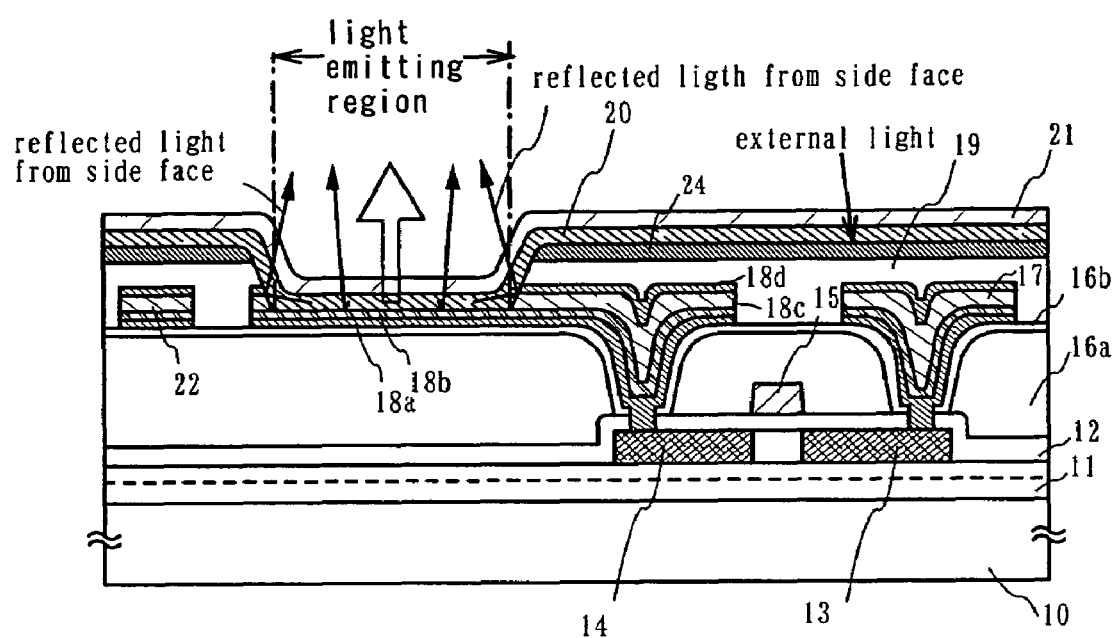
FIG. 3 is a diagram showing Embodiment Mode 3.

This embodiment mode gives a description on another structural example with reference to FIG. 3. FIG. 3 differs from FIGS. 1A and 1B only partially, therefore, identical components are denoted by the same reference symbols.

In FIG. 3, a four-layer structure is employed for wiring: a titanium film as 18a, a titanium nitride film as 18b, a film mainly containing aluminum as 18c, and another titanium nitride film as 18d are layered in this order. The film 18b which is in contact with the organic compound-containing layer 20 functions as the anode. The same laminate structure is used to form the power supplying line 17. The above laminate structure includes a film that mainly contains aluminum and the wire can therefore have a reduced resistivity. The source wire 22 and others are formed at the same time when the wire is formed.

The manufacturing process includes forming a first electrode from a metal film, forming a partition wall that covers end portions of the first electrode, and forming stepped portions in the ends of the first electrode by partially etching the partition wall and etching away a large portion of the first electrode at its center through self-aligning etching with the partition wall as a mask. Through this etching, the center of the first electrode is thinned and leveled to have a flat surface, whereas the ends of the first electrode that are covered with the partition wall remain thick, thereby giving the first electrode a concave shape. The structure shown in FIG. 3 prevents stray light and at the same time increases the amount of emitted light that is taken out in a certain direction (the direction that passes through the second electrode) by having laterally emitted light reflected, or by collecting the laterally emitted light, at the slopes that are formed in the stepped portions of the first electrode.

Accordingly, the sloped portion 18c is preferably formed of a material mainly containing aluminum, silver, or other metal that reflects light, whereas the center of the first electrode that comes into contact with the organic compound-containing layer is preferably formed of an anode material having large work function or a cathode material having small work function. The sloped portion formed of a material that mainly contains aluminum, silver, or the like reflects outside light. Therefore, the other portions than the sloped portion should be covered with a low reflectance material, desirably, the light-absorbing multilayer film. The film 18d is a material layer for preventing oxidization, corrosion, and hillock or the like, and is not always necessary. Ultimately, the angle of the slope descending toward the center of the first electrode (angle of inclination or taper angle) is larger than 30° and smaller than 70°, preferably, 54. 7°, to reflect light emitted from the organic compound-containing layer which is formed later.

This embodiment mode can be combined freely with Embodiment Mode 1 or Embodiment Mode 2.

The present invention structured as above will be described in more detail through the following embodiments.

Embodiment 1

Figure 2A:
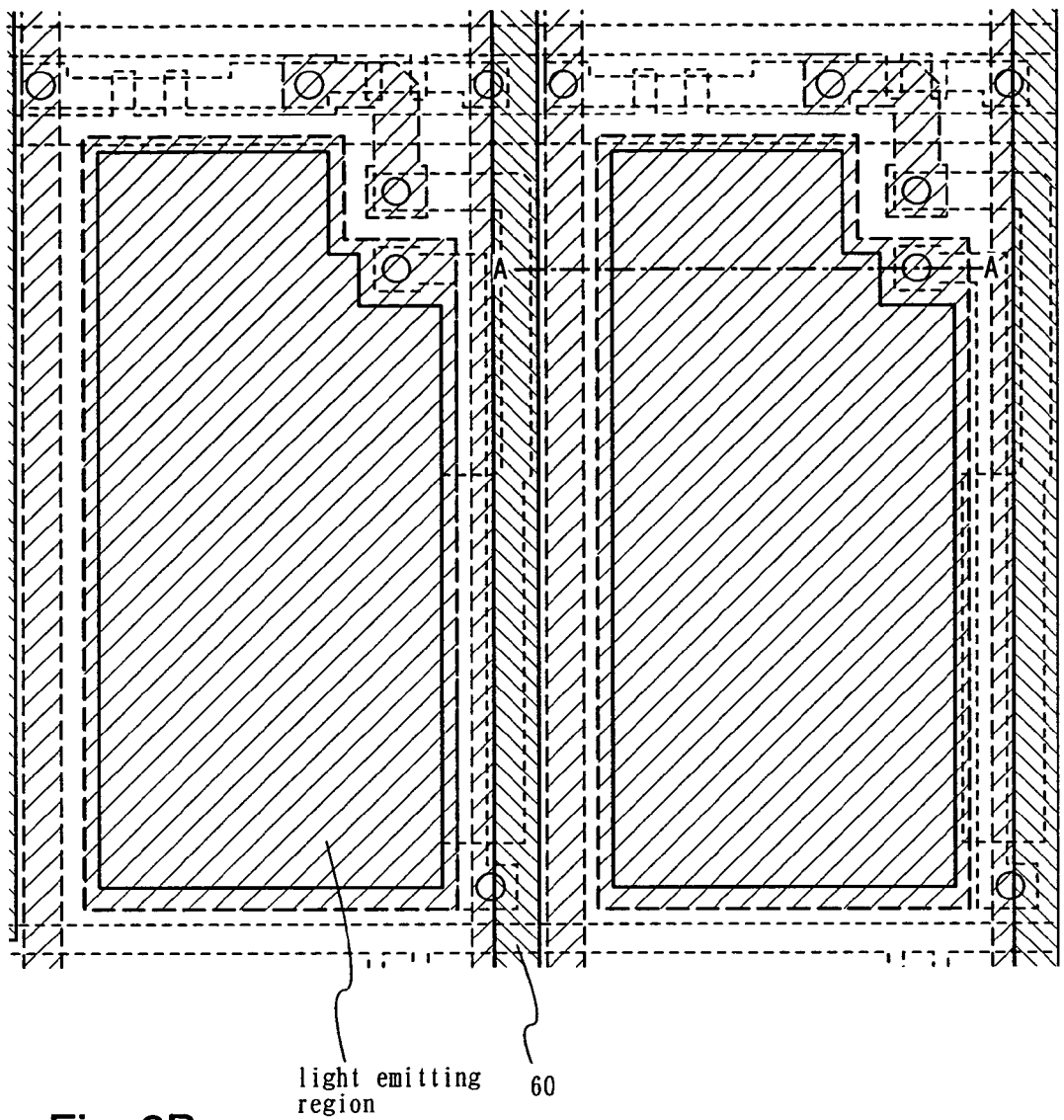
FIGS. 2A and 2B are diagrams showing Embodiment 1.
Figure 2B:
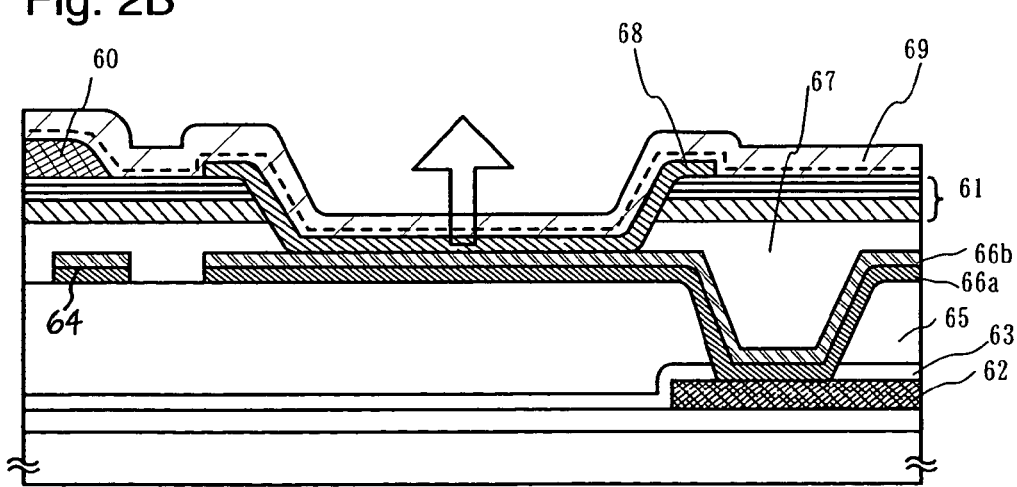

In this embodiment, a brief description is given with reference to FIGS. 2A to 2B on an example of procedure of forming a light emitting element in accordance with the present invention.

First, a base insulating film is formed on a substrate which has an insulating surface.

The base insulating film is a laminate and the first layer is a silicon oxynitride film formed to have a thickness of 10 to 200 nm (preferably 50 to 100 nm) by plasma CVD using as reaction gas $SiH_4$, $NH_3$, and $N_2O$. Here, a silicon oxynitride film (composition ratio: Si=32%, O=27%, N=24%, H=17%) with a thickness of 50 nm is formed. The second layer of the base insulating film is a silicon oxynitride film formed to have a thickness of 50 to 200 nm (preferably 100 to 150 nm) by plasma CVD using as reaction gas $SiH_4$ and $N_2O$. Here, a silicon oxynitride film (composition ratio: Si=32%, O=59%, N=7%, H=2%) with a thickness of 100 nm is formed. Although the base insulating film in this embodiment has a two-layer structure, a single layer or a laminate of more than two layers of the above insulating films may be employed instead.

Next, a semiconductor layer is formed on the base film. The semiconductor layer to serve as an active layer of the TFT is obtained by forming a semiconductor film that has an amorphous structure through a known method (sputtering, LPCVD, plasma CVD, or the like), subjecting the film to known crystallization treatment (laser crystallization, thermal crystallization, thermal crystallization using nickel or other catalysts, or the like), and then patterning the obtained crystalline semiconductor film into a desired shape. The thickness of the semiconductor layer is set to 25 to 80 nm (preferably 30 to 60 nm). The material of the crystalline semiconductor film is not limited but preferably is silicon, a silicon germanium alloy, or the like.

When laser crystallization is employed to form the crystalline semiconductor film, a pulse oscillation type or continuous wave excimer layer, YAG layer, or $YVO_4$ laser is used. Laser light emitted from one of such laser oscillators is collected by an optical system into a linear shape before irradiating the semiconductor film. Crystallization conditions are chosen to suit individual cases. However, when an excimer layer is employed, the pulse oscillation frequency is set to 30 Hz and the laser energy density is set to 100 to 400 $mJ/cm^2$ (typically 200 to 300 $mJ/cm^2$). When a YAG laser is employed, the second harmonic thereof is used, the pulse oscillation frequency is set to 1 to 10 kHz, and the laser energy density is set to 300 to 600 $mJ/cm^2$ (typically 350 to 500 $mJ/cm^2$). The laser light is collected to have a width of 100 to 1000 μm, for example, 400 μm, into a linear shape and the entire surface of the substrate is irradiated with this linear laser light setting the laser light overlap ratio to 80 to 98%.

Next, the surface of the semiconductor layer is washed with an etchant containing hydrofluoric acid to form a gate insulating film 63 that covers the semiconductor layer. The gate insulating film 63 is an insulating film containing silicon and is formed by plasma CVD or sputtering to have a thickness of 40 to 150 nm. In this embodiment, a silicon oxynitride film (composition ratio: Si=32%, O=59%, N=7%, H=2%) is formed by plasma CVD to have a thickness of 115 nm. The gate insulating film is not limited to the silicon oxynitride film, of course, but may be a single layer or laminate of other insulating films that contain silicon.

The surface of the gate insulating film 63 is washed and then a gate electrode is formed.

Next, the semiconductor layer is appropriately doped with an impurity element that imparts a semiconductor the p type conductivity, here, boron (B), to form a source region and a drain region 62. After the doping, the semiconductor layer is subjected to heat treatment, irradiation of intense light, or laser light irradiation in order to activate the impurity element. At the same time the impurity element is activated, plasma damage to the gate insulating film and plasma damage to the interface between the gate insulating film and the semiconductor layer are repaired. It is particularly effective to activate the impurity element by irradiating the substrate from the front or back with the second harmonic of a YAG laser at room temperature to 300° C. A YAG laser is a preferable activation measure because it requires little maintenance.

The subsequent steps include forming an interlayer insulating film 65 from an organic or inorganic material (an applied silicon oxide film, PSG (phosphorus-doped glass), BPSG (glass doped with boron and phosphorus), or the like), hydrogenating the semiconductor layer, and forming contact holes reaching the source region or drain region. Then, a source electrode (wire) and first electrodes (drain electrode) 66a and 66b are formed to complete the TFT (p-channel TFT).

Although the description in this embodiment uses a p-channel TFT, an n-channel TFT can be formed if an n type impurity element (such as P or As) is used instead of a p type impurity element.

The description given in this embodiment takes a top gate TFT as an example. However, the present invention is applicable to any TFT structure. For instance, the invention can be applied to a bottom gate (reverse stagger) TFT and a forward stagger TFT.

Formed through the above steps are the TFT (only the drain region 62 is shown in the drawing), the gate insulating film 63, the interlayer insulating film 65, and the first electrode 66a, 66d.

The first electrodes 66a and 66d in this embodiment are each a film mainly containing an element selected from the group consisting of Ti, TiN, $TiSi_xN_y$, Al, Ag, Ni, W, $WSi_x$, $WN_x$, $WSi_xN_y$, Ta, $TaN_x$, $TaSi_xN_y$, NbN, MoN, Cr, Pt, Zn, Sn, In, and Mo, or a film mainly containing an alloy or compound material of the above elements, or a laminate of these films. The total thickness of the layers is set between 100 nm and 800 nm.

Particularly, the layer 66a of the first electrode that comes into contact with the drain region 62 is preferably formed of a material that can form an ohmic contact with silicon, typically titanium, and is given a thickness of 10 to 100 nm. For the layer 66b of the first electrode, a material that has a large work function when formed into a thin film (TiN, TaN, MoN, Pt, Cr, W, Ni, Zn, Sn) is preferred, and the thickness of the layer is set to 10 to 100 nm. Particularly, when TiN is used as an anode, work function of the film is desirably increased by subjecting its surface to UV light or plasma treatment.

The first electrodes 66a and 66d can be formed at the same time with other wires, for example, a source wire 64, a power supplying line and the like.

Next, a partition wall (also called as a bank, a barrier, or the like) is formed to cover the edge of the first electrode (and a portion that is in contact with the drain region 62). Etching performed to form the shape of the partition wall uses dry etching or wet etching, and is completed in one step or in several steps. When etching is performed to form the shape of the partition wall, it is important to select the materials for the partition wall so that sufficient selective ratios can be kept, respectively. Also, a light-absorbing multilayer film 61 is provided on the top layer of the partition wall to absorb outside light.

An insulator 67 serving as a lower layer of the partition wall is a film or a laminate of inorganic materials (such as silicon oxide, silicon nitride, and silicon oxynitride) and photosensitive or non-photosensitive organic materials (such as polyimide, acrylic, polyamide, polyimideamide, resist, and benzocyclobutene). Photosensitive organic resin is used in this embodiment. If positive photosensitive acrylic is used as a material of the insulator, for example, it is preferable to curve only an upper edge portion of the insulator to give a radius of curvature. A negative photosensitive material which becomes insoluble in an etchant under light and a positive photosensitive material which becomes soluble in an etchant under light both can be used for the insulator 67 serving as the lower layer of the partition wall. For the light-absorbing multilayer film 61 which is the upper layer of the partition wall, a laminate including a reflective metal film, typically, a metal film having Al or Ag as its main component (100 nm or more), a silicon nitride film (with a thickness of 37 nm), a metal nitride film (TiN, TaN and the like) (with a thickness of 66 nm) and silicon nitride film is preferred. Further, the silicon nitride film formed on the reflective metal film prevents oxidization, corrosion and hillock.

Subsequently, an auxiliary electrode 60 is formed in order to lower the electric resistance of a thinly conductive film formed in a later step. The auxiliary electrode 60 can be formed by patterning a metal film obtained by sputtering, or formed by evaporation using an evaporation mask. In the example given in this embodiment, the auxiliary electrode 60 is placed in the direction Y as shown in FIG. 2A. However, arrangement of the auxiliary electrode is not particularly limited and, the auxiliary electrode placed in the direction X may be employed.

Figure 4:
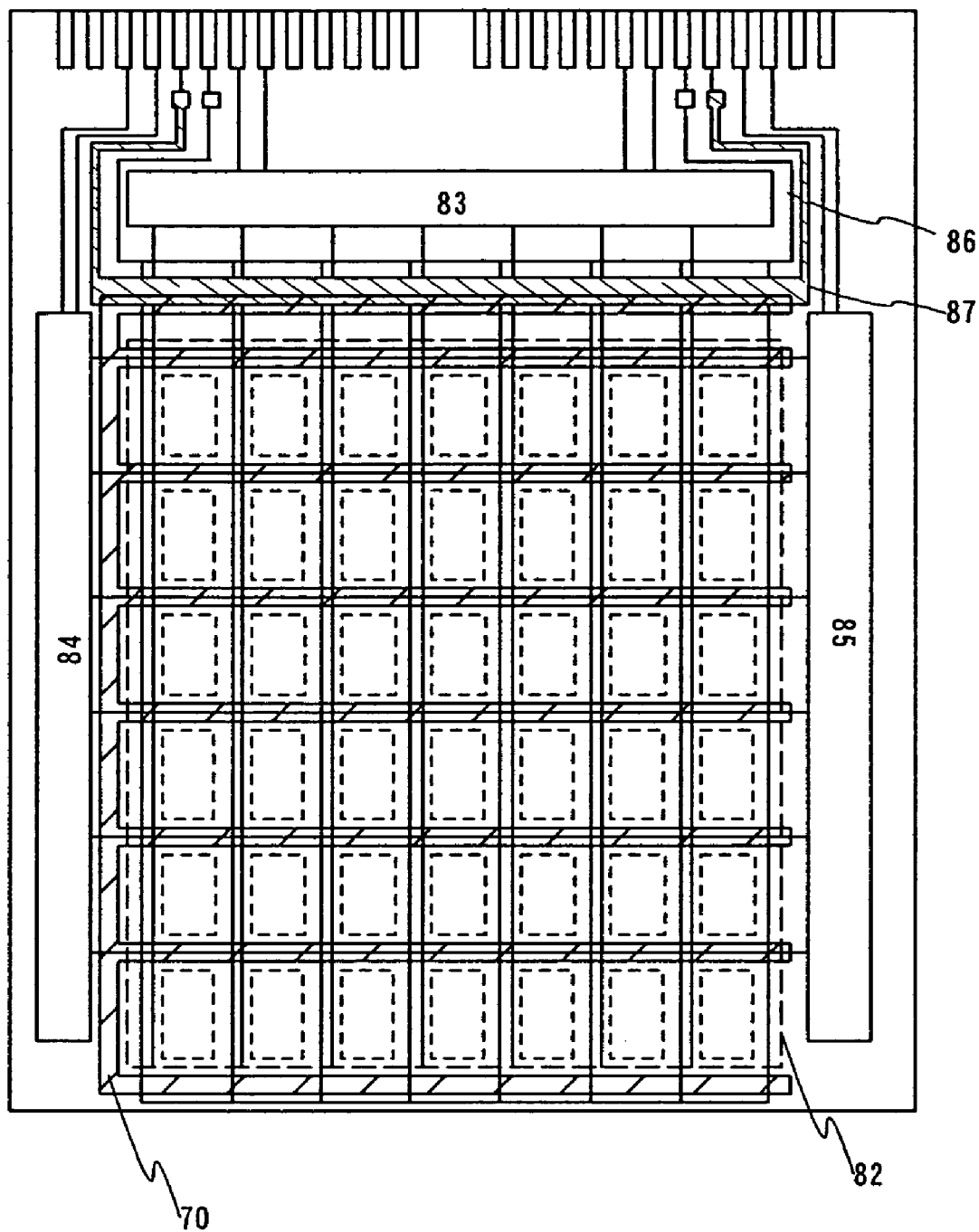
FIG. 4 is a diagram showing Embodiment 1.

FIG. 4 is an exterior diagram of the panel in which an auxiliary electrode is placed in the direction X. The auxiliary electrode (auxiliary wire) 70 is led out as shown in FIG. 4 and comes into contact with a lead-out wire 87 in a region between a pixel portion 82 and a source side driving circuit 83. In FIG. 4, reference symbol 82 denotes the pixel portion, 83, the source side driving circuit, 84 and 85, gate side driving circuits, and 86, a power supplying line. The wires that are formed at the same time the first electrode is formed are the power supplying line 86, the lead-out wire 87, and a source wire. In FIG. 4, a terminal electrode for connecting with an FPC is formed at the same time when a gate wire is formed.

Next, an organic compound-containing layer 68 is formed by evaporation or application (or may be ink-jet). When the evaporation is chosen, for example, a film forming chamber is vacuum-exhausted until the degree of vacuum reaches $5\times10^{-3}$ Torr (0.665 Pa) or less, preferably $10^{-4}$ to $10^{-6}$ Pa, for evaporation. Prior to evaporation, the organic compound is vaporized by resistance heating. The vaporized organic compound flies out to the substrate as the shutter is opened for evaporation. The vaporized organic compound flies top and then deposits on the substrate through an opening formed in a metal mask. Layers of the organic compound-containing layer are formed by evaporation so that the light emitting element as a whole emits white light.

For instance, an $Alq_3$ film, an $Alq_3$ film partially doped with Nile red which is a red light emitting pigment, an $Alq_3$ film, a p-EtTAZ film, and a TPD (aromatic diamine) film are layered in this order to obtain white light.

On the other hand, when the organic-compound containing layer is formed by application using spin coating, the layer after application is preferably baked by vacuum heating. For example, an aqueous solution of poly(ethylene dioxythiophene)/poly(styrene sulfonic acid) (PEDOT/PSS) is applied to the entire surface and baked to form a film that works as a hole injection layer. Then, a polyvinyl carbazole (PVK) solution doped with a luminescence center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) is applied to the entire surface and baked to form a film that works as a light emitting layer.

Although the organic compound layer 68 is a laminate in the above example, a single-layer film may be used as the organic compound layer. For instance, a 1,3,4-oxadiazole derivative (PBD) capable of transporting electrons is dispersed in polyvinyl carbazole (PVK) capable of transporting holes. Another method to obtain white light emission is to disperse 30 wt % of PBD as an electron transporting agent and disperse four kinds of pigments (TPB, coumarin 6, DCM1, and Nile red) in appropriate amounts. Also, the organic compound layer may be a laminate of layers of high molecular weight material and layers of low molecular weight materials.

The next step is to form a thin film containing a metal of small function (a film of an alloy such as MgAg, MgIn, AlLi, $CaF_2$, or CaN, or a film formed by co-evaporation of an element belonging to Group 1 or 2 in the periodic table and aluminum) and to form a thinly conductive film 69 (an aluminum film here) thereon by evaporation (FIG. 2B). An aluminum film is highly capable of blocking moisture and oxygen and therefore is a preferable material of the conductive film for improvement of the reliability of the light emitting device. FIG. 2B is a sectional view taken along the dot-dash line A-A' in FIG. 2A. This laminate is thin enough to let emitted light pass and functions as the cathode in this embodiment. The thin conductive film may be replaced by a transparent conductive film (such as an ITO (indium oxide-tin oxide alloy) film, an $In_2O_3$—ZnO (indium oxide-zing oxide alloy) film, or a ZnO (zinc oxide) film). On the conductive film, an auxiliary electrode may be formed in order to lower the resistance of the cathode. The cathode is formed selectively by resistance heating through evaporation using an evaporation mask.

The thus obtained light emitting element emits white light in the direction indicated by the arrow in FIG. 2B. In addition, since outside light is absorbed by the light-absorbing multilayer film 61 provided on the upper layer of the partition wall, reflected light of the electrodes and wirings can be suppressed.

After the manufacturing process is thus finished up through formation of the second electrode (conductive film), the light emitting element formed on the substrate is sealed by bonding a sealing substrate (transparent substrate) using a seal agent. Spacers formed from a resin film may be provided in order to keep the gap between the sealing substrate and the light emitting element. The space surrounded by the seal agent is filled with nitrogen or other inert gas. For the seal agent, an epoxy-based resin is preferred. Desirably, the material of the seal agent transmits as little moisture and oxygen as possible. A substance having an effect of absorbing oxygen and moisture (e.g., drying agent) may be placed in the space surrounded by the seal agent. In addition, instead of gases, a seal material also can be filled in the space surrounded by the seal agent.

By enclosing the light emitting element in a space as above, the light emitting element can be completely cut off from the outside and external substances that accelerate degradation of the organic compound layer, such as moisture and oxygen, can be prevented from entering the light emitting element. Accordingly, a highly reliable light emitting device is obtained.

This embodiment is also applicable to a light emitting device having a large-sized pixel portion since the resistance of the cathode is lowered by forming the auxiliary electrode 60.

In the example shown in this embodiment, the organic compound-containing layer is formed after the auxiliary electrode 60 is formed. However, in what order they are formed is not particularly limited and the auxiliary electrode 60 may be formed after the organic compound-containing layer 68 is formed.

This embodiment can be combined freely with any one of Embodiment Modes 1 through 3.

Embodiment 2

Further, an exterior view of an active matrix type light emitting device is described with reference to FIGS. 5A to 5B. Further, FIG. 5A is a top view showing the light emitting device and FIG. 5B is a cross-sectional view of FIG. 5A taken along a line A-A'. Reference numeral 901 indicated by a dotted line designates a source signal line driving circuit, numeral 902 designates a pixel portion, and numeral 903 designates a gate signal line driving circuit. Further, numeral 904 designates a seal substrate, numeral 905 designates a seal agent and an inner side surrounded by the seal agent 905 constitutes a seal material (or resin) 907.

Further, reference numeral 908 designates a wiring for transmitting signals inputted to the source signal line driving circuit 901 and the gate signal line driving circuit 903 for receiving a video signal or a clock signal from an FPC (flexible printed circuit) 909 for constituting an external input terminal. Further, although only an FPC is illustrated here, the FPC may be attached with a printed wiring board (PWB). The light emitting device in the specification includes not only a main body of the light emitting device but also a state in which an FPC or a PWB is attached thereto.

Next, a sectional structure will be explained in reference to FIG. 5B. Driving circuits and the pixel portion are formed over a substrate 910 and here, the source signal line driving circuit 901 as the driving circuit and the pixel portion 902 are shown.

Further, the source signal line driving circuit 901 is formed with a CMOS circuit combined with an n-channel type TFT 923 and a p-channel type TFT 924. Further, TFT for forming the driving circuit may be formed by a publicly known CMOS circuit, PMOS circuit or NMOS circuit. Further, although according to the embodiment, a driving integrated type formed with the driving circuits over the substrate is shown, the driving integrated type is not necessarily be needed and the driving circuits can be formed not over the substrate but at outside thereof.

Further, the pixel portion 902 is formed by a plurality of pixels each including a switching TFT 911 and a first electrode (anode) 913 electrically connected to a drain thereof.

Further, a partition wall is formed at the both ends of the first electrode (anode) 913, a side of an insulating layer 914 which is a lower layer of the partition wall forms a slope. Also, it is preferred to form the insulating layer 914 at the same time with a light-absorbing multilayer film provided on the upper layer of the partition wall as described in Embodiment 1. Since outside light is absorbed by the light-absorbing multilayer film provided on the upper layer of the partition wall, the reflected light of electrodes and wirings existing at the lower side can be suppressed. Further, one of the layers out of the light-absorbing multilayer film is a reflective metal film, which is connected to a second electrode 916 to have the same potential.

An organic compound-containing layer 915 is selectively formed on the first electrode (anode) 913 by evaporation using an evaporation mask or ink-jet. Further, a second electrode (cathode) 916 is formed on the organic compound layer 915. Thereby, a light emitting element 918 comprising the first electrode (anode) 912, the organic compound layer 915 and the second electrode (cathode) 916 is formed. Here, the light emitting element 918 shows an example of white color luminescence and therefore, provided with the color filter comprising a coloring layer 931 and BM932 (for simplification, overcoat layer is not illustrated here).

A third electrode (an auxiliary electrode) 917 which is a part of a structure shown in Embodiment 1 is formed on the insulating layer 914 to realize that the second electrode has a lower resistance. The second electrode (cathode) 916 functions also as a wiring common to all the pixels and electrically connected to an FPC 909 via the third electrode 917 and the connection wiring 908.

Further, in order to seal the light emitting element 918 formed on the substrate 910, the seal substrate 904 is pasted by the seal agent 905. Further, a spacer comprising a resin film may be provided for ensuring an interval between the seal substrate 904 and the light emitting element 918. Further, the space 907 on the inner side of the seal agent 905 is filled with a seal material (resin). Further, it is preferable to use epoxy species resin for the seal agent 905. Further, it is preferable that the seal agent 905 is a material for permeating moisture or oxygen as less as possible.

Further, according to this embodiment, as a material for constituting the seal substrate 904, other than a glass substrate or a quartz substrate, a plastic substrate comprising FRP (Fiberglass-Reinforced Plastics), PVF (polyvinyl fluoride), Mylar, polyester or acrylic resin can be used. Further, it is possible to adhere the seal substrate 904 by using the seal agent 905 and thereafter seal to cover a side face (exposed face) by a seal agent.

By sealing the light emitting element with the seal material 907 as described above, the light emitting element can completely be blocked from outside and a substance for expediting to deteriorate the organic compound layer such as moisture or oxygen can be prevented from invading from outside. Therefore, a highly reliable light emitting device can be provided.

Further, this embodiment can freely be combined with Embodiment Modes 1 to 3, and Embodiment 1.

Embodiment 3

This embodiment gives a description on an example of forming an organic compound-containing layer or a cathode using a film formation method and a film formation device (shown in FIGS. 9A and 9B and FIGS. 10A and 10B) which are different from those in Embodiment 1. In this embodiment, the manufacturing process up through formation of the first electrode and the partition wall is identical with the one in Embodiment 1, and the explanation is therefore omitted.

The example shown in Embodiment 1 employs evaporation using an evaporation mask or ink jet to form the organic compound-containing layer and the second electrode. This embodiment is characterized in that a solution containing a luminous material is sprayed under reduced pressure onto the first electrode, namely, pixel electrode (anode or cathode) to deposit the luminous material on the pixel electrode and form a light emitting layer.

The reduced pressure refers to a pressure lower than the atmospheric pressure. In an atmosphere filled with nitrogen, noble gas, or other inert gas (hereinafter referred to inert atmosphere), the reduced pressure is $1 \times 10^2$ to $2 \times 10^4$ Pa (preferably $5 \times 10^2$ to $5 \times 10^3$ Pa). In vacuum, the reduced pressure is 1 to $5 \times 10^4$ Pa ($1 \times 10^2$ to $1 \times 10^3$ Pa). Under the reduced pressure, the solvent in drops of the solution is vaporized the instant the solution is released in the atmosphere in a jet stream and continues to vaporize until the jet stream reaches the pixel electrode, thus reducing the volume of the drops. Almost all of the solvent has vaporized by the time the solution reaches the pixel electrode, and the formation of the film is completed upon the arrival. In short, this method is superior to prior art in that it does not need a heating step such as a baking step after application of the solution. If the pixel electrode is heated at 50 to 200° C. at this point, the solvent that remains after the application can readily be vaporized and it is therefore effective in improving the film quality even more.

Since most of the solvent should be vaporized before the solution arrives at the pixel electrode, a material that is as highly volatile as possible (in other words, a material having high vapor pressure) is preferred as a solvent in the present invention. If a solvent used has low volatility, the distance between the pixel electrode and the tip of the nozzle through which the solution is sprayed has to be set large to allow the solvent more time to vaporize. The longer the distance is, the larger the trajectory error of the solution drops grows.

Figure 10A:
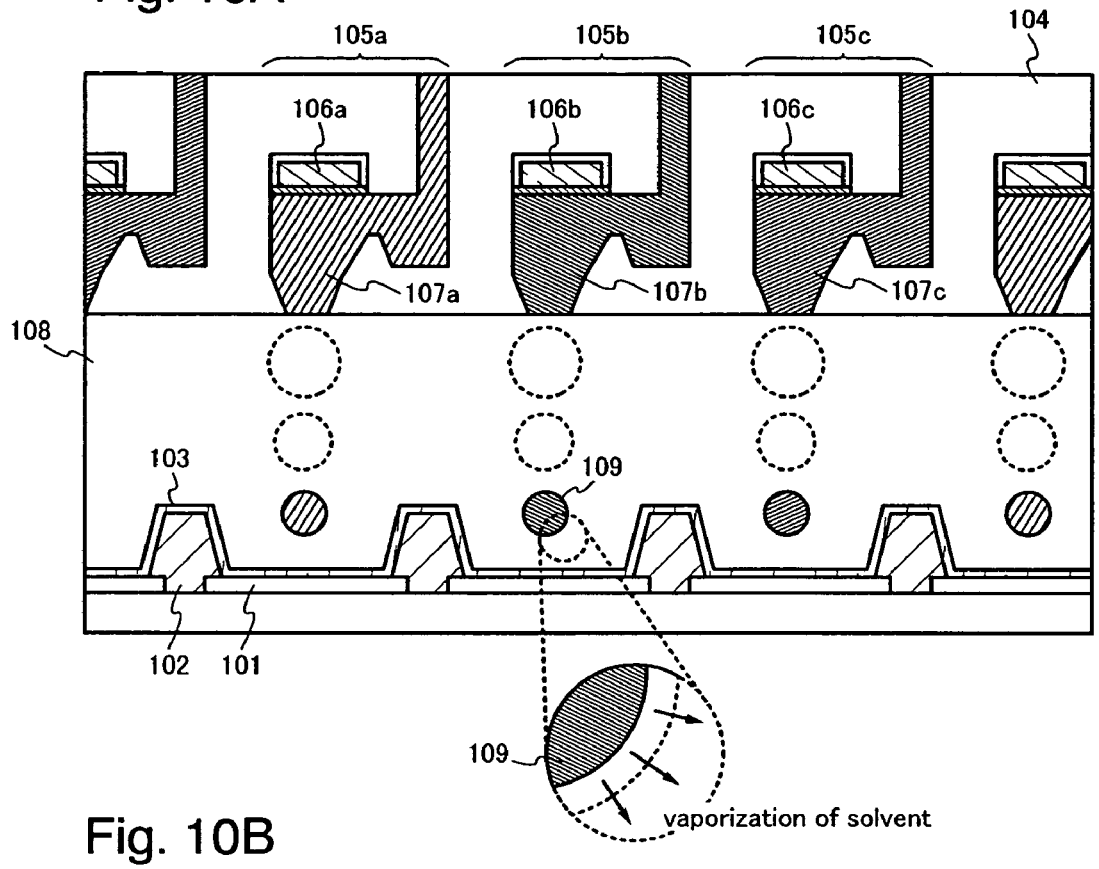
FIGS. 10A and 10B are diagrams showing an example of the manufacturing apparatus (Embodiment 3)
Figure 10B:
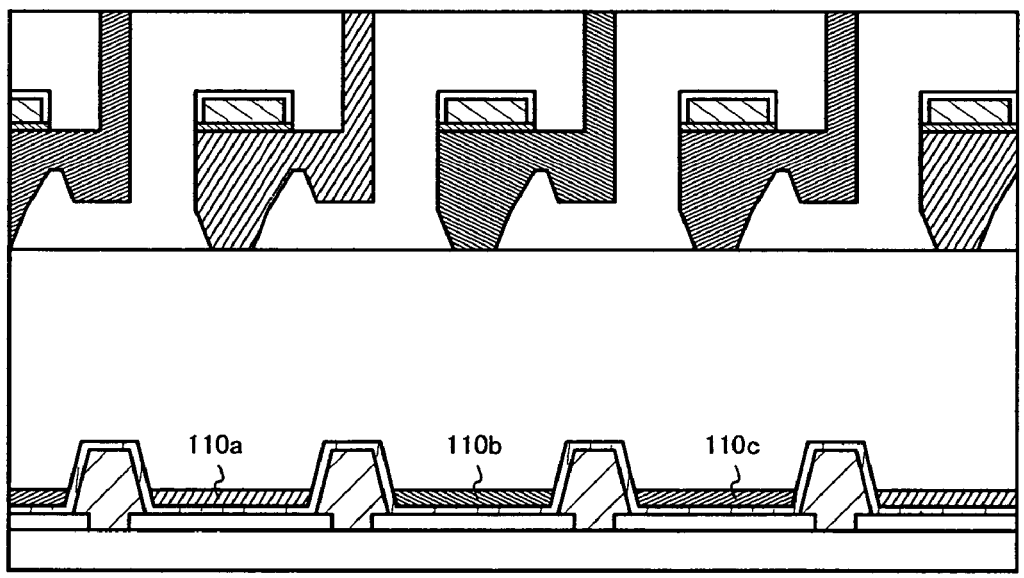

FIG. 10A shows a state immediately after the solution containing a luminous material is sprayed. FIG. 10B shows a state after the luminous material reaches the anode or the cathode and forms a thin film (light emitting layer).

In FIG. 10A, reference symbol 101 denotes the anode or the cathode; 102, the partition wall for separating one pixel from another; and 103, a carrier injection layer. The carrier injection layer 103 is a hole injection layer if reference symbol 101 is the anode, and if reference symbol 101 is the cathode, the carrier injection layer 103 is an electron injection layer. Denoted by reference symbol 104 is a head portion of a device for applying the solution (hereinafter referred to as solution applying device) and the head portion shown is enlarged to partially show its internal structure. The head portion 104 has jet portions 105a to 105c whose function is to spray the solution containing a luminous material. The jet portions 105a to 105c are provided with piezoelectric elements 106a to 106c, respectively. The jet portions 105a to 105c are filled with luminous material-containing solutions 107a to 107c, respectively.

Here, the luminous material-containing solution 107a contains a luminous material that emits red light. The luminous material-containing solution 107b contains a luminous material that emits green light. The luminous material-containing solution 107c contains a luminous material that emits blue light. These three kinds of luminous material separately make a pixel that emits red light, a pixel that emits green light, and a pixel that emits blue light, which are treated together as one pixel unit. Although FIG. 10A shows only one jet portion for each of R (red), G (green), and B (blue) pixels, plural jet portions (nozzles) may be arranged in parallel. Considering the throughput, the most desirable arrangement is to set a number of jet portions in parallel with their number matched to the number of one row or column of pixels (pixel number) in the pixel portion.

The most distinguishable feature of the film formation device of FIGS. 10A and 10B is that a space 108 between the head portion 104 and the anode or cathode 101 is kept at a reduced pressure, namely, a pressure lower than the atmospheric pressure. Specifically, the reduced pressure is $1 \times 10^2$ to $2 \times 10^4$ Pa (preferably $5 \times 10^2$ to $5 \times 10^3$ Pa) in an inert atmosphere and 1 to $5 \times 10^4$ Pa ($1 \times 10^2$ to $1 \times 10^3$ Pa) in vacuum. The luminous material-containing solutions 107a to 107c filling the jet portions 105a to 105c are pressurized by a change in volume of the piezoelectric elements 106a to 106c and are pushed out to be sprayed onto the pixel electrode 101. A sprayed drop 109 travels forward while vaporizing its solvent under reduced pressure, and the luminous material left is deposited on the pixel electrode 101. As a result, the luminous material is deposited intermittently.

The thin film thus formed by deposition is sufficiently removed of solvent component and thinned without vaporizing the solvent by a special measure such as heating. Accordingly, the resultant light emitting layer is freer from problems caused by degasification, such as degradation with time. With the above structure, baking or a similar process after application of the solution is made unnecessary to greatly improve the throughput and avoid degradation of the luminous material itself from heating. Although the present invention is characterized by needing no baking, baking such as heat treatment in vacuum can be added without spoiling the effect of the present invention which is to obtain a light emitting layer that is sufficiently removed of solvent component and suffers less degasification.

In this way, a light emitting layer 110a which emits red light, a light emitting layer 110b which emits green light, and a light emitting layer 110c which emits blue light are formed as shown in FIG. 10B. Thereafter, a carrier transporting layer, a carrier injection layer, and the like are formed as needed, and then the second electrode, namely, the opposite electrode (cathode if the pixel electrode is the anode, anode if the pixel electrode is the cathode) is formed to complete light emitting elements.

In the example shown in this embodiment, the solution is applied by spraying drops of the solution. However, there is no particular limitation and a gel-like solution having a certain viscosity may be applied instead.

FIGS. 9A and 9B show an example of combining the solution applying device used in this embodiment with in-line manufacture apparatus for the steps from forming luminous bodies through sealing light emitting elements. FIG. 9A is a top view and FIG. 9B is a side view.

In FIGS. 9A and 9B, reference symbol 161 denotes a loading chamber for bring a substrate into the apparatus. Reference symbol 162 denotes an unloading chamber for taking a substrate out. Reference symbol 163 is a film formation chamber for forming a hole injection layer. Denoted by reference symbol 164 is a film formation chamber for forming a light emitting layer. Reference symbol 165 is a film formation chamber for forming an electron injection layer. Reference symbol 166 denotes a film formation chamber for forming a metal film that serves as a cathode. Denoted by reference symbol 167 is a film formation chamber for forming a protective film that has a passivation effect. An arrow 170 in the drawings indicates a direction in which a substrate 160 is transported. A substrate that has been through the processing is indicated by the dotted line. The substrate 160 is transported standing upright, in other words, in a manner that makes its surface (the face to be processed) parallel to the gravity direction.

Although not shown in the drawings for simplification, a TFT, a first electrode, a partition wall, and other components are formed in advance on the substrate 160. In this embodiment, a substrate that has been finished up through formation of the partition wall in accordance with Embodiment 1 is set in the loading chamber.

The film formation chambers 163 to 165 each serve as the solution applying device of this embodiment, and the chambers 163, 164, and 165 have head portions 163a, 164a, and 165a, respectively. Each of the head portions is structured as shown in FIGS. 10A and 10B, so that a solution containing an organic compound or an inorganic compound is applied to form a thin film under reduced pressure. The apparatus may have a mechanism for heating the substrate 160 at 150 to 200° C. An arrow 171 shown in FIG. 9B indicates the direction in which the head portion 164a moves, and application of a solution for forming a thin film is started from one end of the substrate 160 toward the other end.

During the application, nitrogen, noble gas, or other fluorinated gas flows in the film formation chambers 163 to 165 from top to bottom in the direction perpendicular to the paper face of the drawings to create a laminar flow of inert gas between the substrate 160 and the head portions 163a to 165a. Instead of heating the substrate, or in addition to heating of the substrate, the flowing inert gas may be heated. Vacuum may be chosen in place of introducing inert gas.

The film formation chamber 166 is a chamber for forming by sputtering a metal film that serves as a cathode. The metal film is formed while the substrate 160 passes by a rectangular target 166a. A metal film containing an element that belongs to Group 1 or 2 in the periodic table, for example, an aluminum-lithium alloy film can be formed. The shape of the target 166*a* is not limited to a rectangle. However, an advantage of holding the substrate 160 vertically is that the apparatus area can be reduced by using a linear, rectangular, oblong, or other elongated shape target while ensuring high throughput.

The film formation chamber 167 is a chamber for forming by sputtering (preferably high frequency sputtering) an insulating film which has a passivation effect. The insulating film is formed as the substrate 160 passes by a rectangular target 167*a*. A highly dense silicon compound film such as a silicon nitride film or a silicon nitroxide film can be formed. The shape of the target 167*a* is not limited to a rectangle. However, an advantage of holding the substrate 160 vertically is that the apparatus area can be reduced by using a linear, rectangular, oblong, or other elongated shape target while ensuring high throughput.

The manufacture apparatus shown in FIGS. 9A and 9B is characterized in that the thin film is formed as soon as the solution is applied, therefore, baking or similar process is unnecessary. However, a step of baking such as heating in vacuum may be put between film formation steps in each of the film formation chambers 163 to 166. This is because more solvent removed from thin films including a light emitting layer equals to improvement of the reliability that much.

This embodiment can be combined freely with Embodiment Modes 1 through 3, Embodiment 1, and Embodiment 2.

Embodiment 4

By implementing the present invention, all of electronic apparatuses integrated with a module having a layer containing an organic component as a light emitting layer (active matrix type EL module) are completed.

As such electronic apparatuses, a video camera, a digital camera, a head mount display (goggle type display), a car navigation apparatus, a projector, a car stereo, a personal computer, a portable information terminal (mobile computer, portable telephone or electronic book) and the like are pointed out. FIGS. 11 and 12 show examples of these.

Figure 11A:
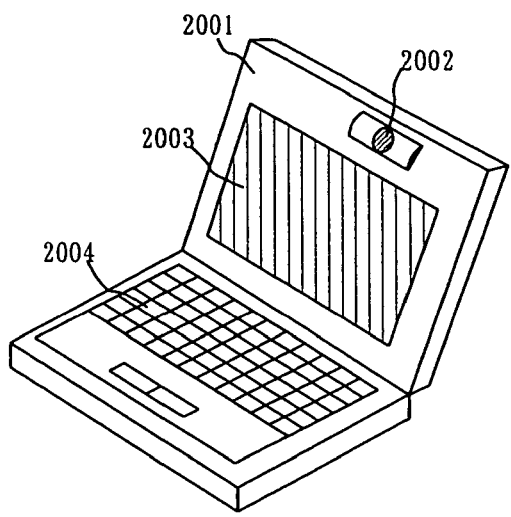
FIGS. 11A to 11F are diagrams showing examples of electronic apparatuses (Embodiment 4)

FIG. 11A is a personal computer which includes a main body 2001, an image input portion 2002, a display portion 2003 and a keyboard 2004.

Figure 11B:
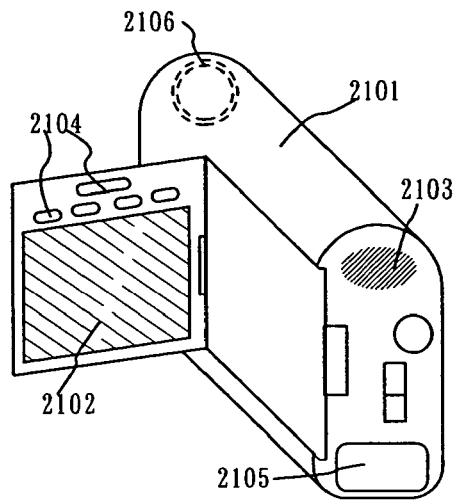

FIG. 11B is a video camera which includes a main body 2101, a display portion 2102, a voice input portion 2103, an operation switch 2104, a battery 2105, an image receiving portion 2106.

Figure 11C:
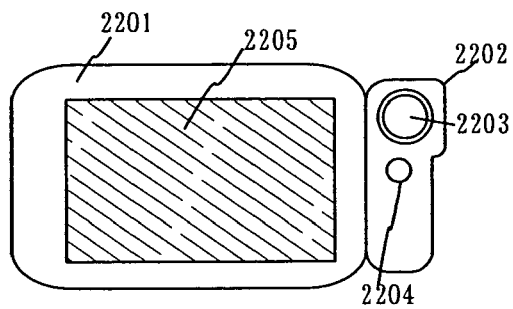

FIG. 11C is a mobile computer which includes a main body 2201, a camera portion 2202, an image receiving portion 2203, an operation switch 2204 and a display portion 2205.

Figure 11D:
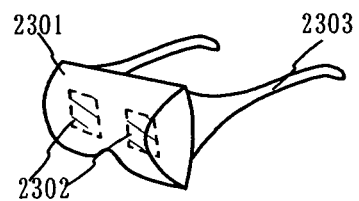

FIG. 11D is a goggle type display which includes a main body 2301, a display portion 2302 and an arm portion 2303.

Figure 11E:
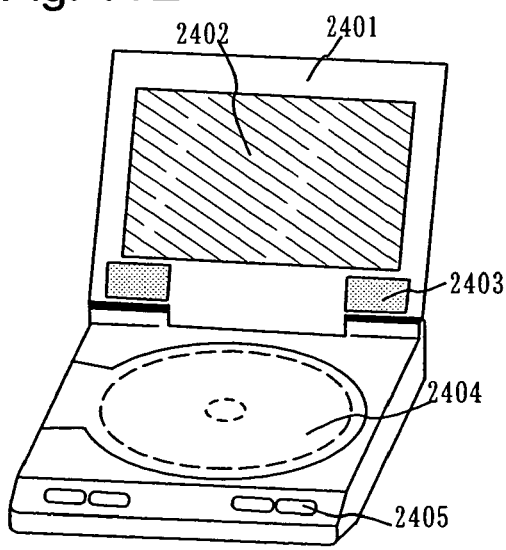

FIG. 11E is a player using a record medium recorded with programs (hereinafter, referred to as record medium) which includes a main body 2401, a display portion 2402, a speaker portion 2403, a record medium 2404 and an operation switch 2405. Further, the player uses DVD (Digital Versatile Disc) or CD as a record medium and can enjoy music, enjoy movie and carry out the game or Internet.

Figure 11F:
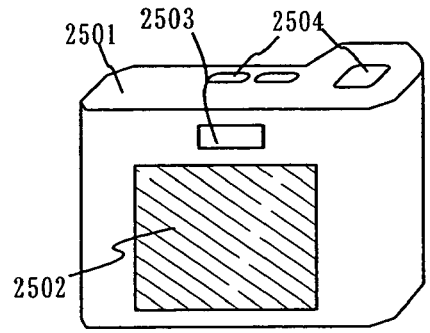

FIG. 11F is a digital camera which includes a main body 2501, a display portion 2502, an eye-piece portion 2503, an operation switch 2504 and an image receiving portion (not illustrated).

Figure 12A:
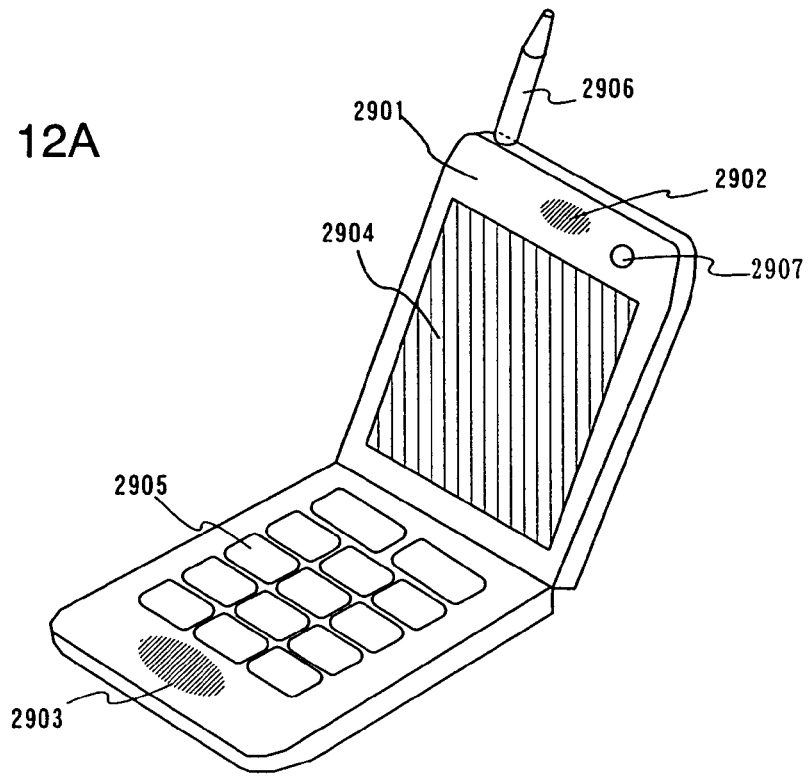
FIGS. 12A to 12C are diagrams showing examples of electronic apparatuses (Embodiment 4).

FIG. 12A is a portable telephone which includes a main body 2901, a voice output portion 2902, a voice input portion 2903, a display portion 2904, an operation switch 2905, an antenna 2906 and an image input portion (CCD, image sensor) 2907.

Figure 12B:
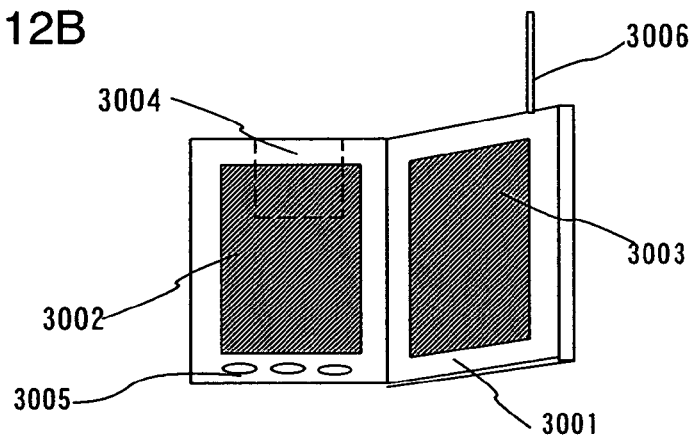

FIG. 12B is a portable book (electronic book) which includes a main body 3001, display portions 3002, 3003, a record medium 3004, an operation switch 3005, an antenna 3006.

Figure 12C:
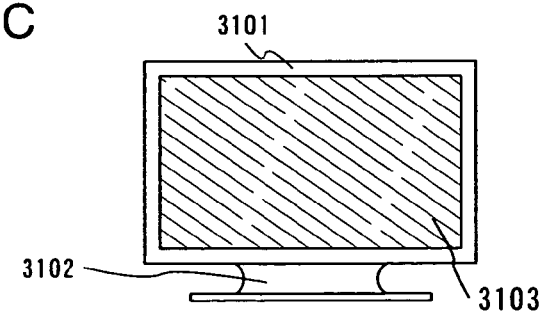

FIG. 12C is the display which includes a main body 3101, a support base 3102 and a display portion 3103.

Incidentally, the display shown in FIG. 12C is of a screen size of middle or small type or large type, for example, a screen size of 5 to 20 inches. Further, in order to form the display portion of this size, it is preferable to use a display portion having a side of a substrate of 1 m and carry out mass production by taking many faces. In case that the screen having a size of middle or small type or large type is formed, it is preferable that the auxiliary electrode shown in Embodiment 2 or Embodiment 3 is formed.

As described above, a range of applying the invention is extremely wide and is applicable to a method of fabricating electronic apparatus of all the fields. Further, the electronic apparatus of the embodiment can be realized by using a constitution comprising any combination of Embodiment Modes 1 to 3 and Embodiments 1 to 3.

According to the present invention, in a top emission type light emitting device, a light-absorbing multilayer film prevents outside light from being reflected by an electrode which is not in a light emitting region and by a wire.

What is claimed is:

1. A light emitting device comprising:
   a substrate having an insulating surface;
   a thin film transistor formed over the substrate;
   an insulating film formed over the thin film transistor;
   a first electrode formed over the insulating film and connected to the thin film transistor through the insulating film;
   a partition wall covering an edge of the first electrode and formed over the insulating film;
   a layer comprising an organic compound formed over and in contact with the first electrode; and
   a second electrode in contact with the layer comprising an organic compound,
   wherein the partition wall comprises a laminate of an organic resin layer and a light-absorbing layer including at least a reflective metal film, a first light transmissive insulating film comprising nitride, a metal nitride film and, a second light-transmissive insulating film comprising nitride,
   wherein the organic resin layer comprises a top surface and a side surface, the side surface being tapered,
   wherein the light absorbing layer entirely covers the top surface of the organic resin layer, and
   wherein the layer comprising an organic compound is in contact with the side surface of the organic resin layer.

2. A light emitting device according to claim 1, wherein the partition wall covers other regions than a light emitting region in which the first electrode and the layer comprising an organic compound are in contact with each other.

3. A light emitting device according to claim 1, wherein the light-absorbing layer comprises at least a layer comprising a material selected from the group consisting of $Al_2O_3$, $SiO_2$, $ZrO_2$, $HfO_2$, $Sc_2O_3$, $TiO_2$, ITO and ZnO.

4. A light emitting device according to claim 1, wherein the light-absorbing layer includes at least a layer comprising a material selected from the group consisting of Al, Cu, Au, Mo, Ni, Pt, Rh, Ag, W, Cr, Co, Si, Zr, Ta, Inconel and Nichrome.

5. A light emitting device according to claim 1, wherein the light-absorbing layer comprises a laminate of a metal film mainly composed of aluminum, a silicon nitride film, a titanium nitride film, and another silicon nitride film as the reflective metal film, the first light transmissive insulating film comprising nitride, the metal nitride film, and the second light-transmissive insulating film comprising nitride.

6. A light emitting device according to claim 1, wherein the second electrode is a conductive film transmissive of light.

7. A light emitting device according to claim 1, wherein the first electrode has a concave shape and is formed in a self-aligning manner using the partition wall as a mask.

8. A light emitting device according to claim 1, wherein the first electrode is an anode and the second electrode is a cathode.

9. A light emitting device according to claim 1, wherein the first electrode is a cathode and the second electrode is an anode.

10. A light emitting device according to claim 1, wherein the layer comprising an organic compound is made of a material emitting red light, green light, or blue light.

11. A light emitting device according to claim 1, wherein the layer comprising an organic compound comprises a material emitting white light, and is combined with a color filter provided in a sealing member.

12. A light emitting device according to claim 1, wherein the layer comprising an organic compound comprises a material emitting monochromatic light, and is combined with one of a color conversion layer and a colored layer provided in a sealing member.

13. A light emitting device according to claim 1, wherein the light emitting device is any one of a video camera, a digital camera, a goggle-type display, a car navigation system, a personal computer, a DVL) player, an electronic game machine, and a portable information terminal.

14. A light emitting device according to claim 1, wherein the first electrode comprises at least two layers.

15. A light emitting device comprising:
a substrate having an insulating surface;
a thin film transistor formed over the substrate;
an insulating film formed over the thin film transistor;
a first electrode formed over the insulating film and connected to the thin film transistor through the insulating film;
a partition wall covering an edge of the first electrode and formed over the insulating film;
a layer comprising an organic compound formed over and in contact with the first electrode; and
a second electrode in contact with the layer comprising an organic compound,
wherein the partition wall comprises a laminate of an organic resin layer and a light-absorbing multilayer film including at least a reflective metal film, a first light transmissive insulating film comprising nitride, a metal nitride film, and a second light-transmissive insulating film comprising nitride,
wherein the organic resin layer comprises a top surface and a side surface, the side surface being tapered,
wherein the light absorbing multilayer film entirely covers the top surface of the organic resin layer, and
wherein the layer comprising an organic compound is in contact with the side surface of the organic resin layer.

16. A light emitting device according to claim 15, wherein the partition wall covers other regions than a light emitting region in which the first electrode and the layer comprising an organic compound are in contact with each other.

17. A light emitting device according to claim 15, wherein the light-absorbing multilayer film comprises at least a layer comprising a material selected from the group consisting of $Al_2O_3$, $SiO_2$, $ZrO_2$, $HfO_2$, $Sc_2O_3$, $TiO_2$, ITO and ZnO.

18. A light emitting device according to claim 15, wherein the light-absorbing multilayer film comprises at least a layer comprising a material selected from the group consisting of Al, Cu, Au, Mo, Ni, Pt, Rh, Ag, W, Cr, Co, Si, Zr, Ta, Inconel and Nichrome.

19. A light emitting device according to claim 15, wherein the light-absorbing multilayer film comprises a laminate of a metal film mainly composed of aluminum, a silicon nitride film, a titanium nitride film, and another silicon nitride film, stacked in this order as the reflective metal film, the first light transmissive insulating film comprising nitride, the metal nitride film, and the second light-transmissive insulating film comprising nitride.

20. A light emitting device according to claim 15, wherein the second electrode is a conductive film transmissive of light.

21. A light emitting device according to claim 15, wherein the first electrode has a concave shape and is formed in a self-aligning manner using the partition wall as a mask.

22. A light emitting device according to claim 15, wherein the first electrode is an anode and the second electrode is a cathode.

23. A light emitting device according to claim 15, wherein the first electrode is a cathode and the second electrode is an anode.

24. A light emitting device according to claim 15, wherein the layer comprising an organic compound is made of a material emitting red light, green light, or blue light.

25. A light emitting device according to claim 15, wherein the layer comprising an organic compound comprises a material emitting white light, and is combined with a color filter provided in a sealing member.

26. A light emitting device according to claim 15, wherein the layer comprising an organic compound comprises a material emitting monochromatic light, and is combined with one of a color conversion layer and a colored layer provided in a sealing member.

27. A light emitting device according to claim 15, wherein the light emitting device is any one of a video camera, a digital camera, a goggle-type display, a car navigation system, a personal computer, a DVD player, an electronic game machine, and a portable information terminal.

28. A light emitting device according to claim 15, wherein the first electrode comprises at least two layers.

29. A light emitting device comprising:
a first electrode connected to a thin film transistor over a substrate having an insulating surface;
a partition wall covering an edge of the first electrode;
a layer comprising an organic compound in contact with the first electrode; and
a second electrode in contact with the layer comprising an organic compound,
wherein the partition wall comprises a laminate of an organic resin layer and a light-absorbing multilayer film including a reflective metal film, a first light transmissive insulating film comprising nitride, a metal nitride film, and a second light-transmissive insulating film comprising nitride.

30. A light emitting device according to claim 29, wherein the partition wall covers other regions than a light emitting region in which the first electrode and the layer comprising an organic compound are in contact with each other.

31. A light emitting device according to claim 29, wherein the light-absorbing multilayer film includes at least one layer comprising a material selected from the group consisting of $Al_2O_3$, $SiO_2$, $ZrO_2$, $HfO_2$, $Sc_2O_3$, $TiO_2$, ITO and ZnO.

32. A light emitting device according to claim 29, wherein the light-absorbing multilayer film includes at least a layer comprising a material selected from the group consisting of Al, Cu, Au, Mo, Ni, Pt, Rb, Ag, W, Cr, Co, Si, Zr, Ta, Inconel and Nichrome.

33. A light emitting device according to claim 29, wherein the reflective metal film is mainly composed of aluminum.

34. A light emitting device according to claim 29, wherein at least one of the first and second light transmissive insulating films is a silicon nitride film.

35. A light emitting device according to claim 29, wherein the metal nitride film is a titanium nitride film.

36. A light emitting device according to claim 29, wherein the second electrode is a conductive film transmissive of light.

37. A light emitting device according to claim 29, wherein the first electrode has a concave shape and is formed in a self-aligning manner using the partition wall as a mask.

38. A light emitting device according to claim 29, wherein the first electrode is an anode and the second electrode is a cathode.

39. A light emitting device according to claim 29, wherein the first electrode is a cathode and the second electrode is an anode.

40. A light emitting device according to claim 29, wherein the layer comprising an organic compound is made of a material emitting red light, green light, or blue light.

41. A light emitting device according to claim 29, wherein the layer comprising an organic compound comprises a material emitting white light, and is combined with a color filter provided in a sealing member.

42. A light emitting device according to claim 29, wherein the layer comprising an organic compound comprises a material emitting monochromatic light, and is combined with one of a color conversion layer and a colored layer provided in a sealing member.

43. A light emitting device according to claim 29, wherein the light emitting device is any one of a video camera, a digital camera, a goggle-type display, a car navigation system, a personal computer, a DVD player, an electronic game machine, and a portable information terminal.

44. A light emitting device according to claim 29, wherein the first electrode comprises at least two layers.

45. A light emitting device comprising:
a substrate having an insulating surface;
a thin film transistor formed over the substrate;
an insulating film formed over the thin film transistor;
a first electrode formed over and in contact with the insulating film and connected to the thin film transistor though the insulating film;
a partition wall covering an edge of the first electrode and formed over the insulating film;
a layer comprising an organic compound formed over and in contact with the first electrode; and
a second electrode in contact with the layer comprising an organic compound,
wherein the partition wall comprises a laminate of an organic resin layer and a light-absorbing multilayer film including at least a reflective metal film, a first light transmissive insulating film comprising nitride, a metal nitride film, and a second light-transmissive insulating film comprising nitride,
wherein the organic resin layer comprises a top surface and a side surface, the side surface being tapered,
wherein the light absorbing multilayer film entirely covers the top surface of the organic resin layer, and
wherein the layer comprising an organic compound is in contact with the side surface of the organic resin layer.

46. A light emitting device according to claim 45, wherein the partition wall covers other regions than a light emitting region in which the first electrode and the layer comprising an organic compound are in contact with each other.

47. A light emitting device according to claim 45, wherein the light-absorbing multilayer film comprises at least a layer comprising a material selected from the group consisting of $Al_2O_3$, $SiO_2$, $ZrO_2$, $HfO_2$, $Sc_2O_3$, $TiO_2$, ITO and ZnO.

48. A light emitting device according to claim 45, wherein the light-absorbing multilayer film includes at least a layer comprising a material selected from the group consisting of Al, Cu, Au, Mo, Ni, Pt, Rh, Ag, W, Cr, Co, Si, Zr, Ta, Inconel and Nichrome.

49. A light emitting device according to claim 45, wherein the light-absorbing multilayer film comprises a laminate of a metal film mainly composed of aluminum, a silicon nitride film, a titanium nitride film, and another silicon nitride film as the reflective metal film, the first light transmissive insulating film comprising nitride, the metal nitride film, and the second light-transmissive insulating film comprising nitride.

50. A light emitting device according to claim 45, wherein the second electrode is a conductive film transmissive of light.

51. A light emitting device according to claim 45, wherein the first electrode has a concave shape and is formed in a self aligning manner using the partition wall as a mask.

52. A light emitting device according to claim 45, wherein the first electrode is an anode and the second electrode is a cathode.

53. A light emitting device according to claim 45, wherein the first electrode is a cathode and the second electrode is an anode.

54. A light emitting device according to claim 45, wherein the layer comprising an organic compound is made of a material emitting red light, green light, or blue light.

55. A light emitting device according to claim 45, wherein the layer comprising an organic compound comprises a material emitting white light, and is combined with a color filter provided in a sealing member.

56. A light emitting device according to claim 45, wherein the layer comprising an organic compound comprises a material emitting monochromatic light, and is combined with one of a color conversion layer and a colored layer provided in a sealing member.

57. A light emitting device according to claim 45, wherein the light emitting device is any one of a video camera, a digital camera, a goggle-type display, a car navigation system, a personal computer, a DVD player, an electronic game machine, and a portable information terminal.

58. A light emitting device according to claim 45, wherein the first electrode comprises at least two layers.

* * * * *

UNITED STATES PATENT AND TRADEMARK OFFICE
CERTIFICATE OF CORRECTION

PATENT NO. : 7,663,305 B2
APPLICATION NO. : 10/602980
DATED : February 16, 2010
INVENTOR(S) : Yamazaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 45 days.

Signed and Sealed this

Thirtieth Day of November, 2010

David J. Kappos
*Director of the United States Patent and Trademark Office*